US012159944B2

United States Patent
Soneda et al.

(10) Patent No.: US 12,159,944 B2
(45) Date of Patent: Dec. 3, 2024

(54) RC-IGBT WITH LIFETIME CONTROL LAYER

(71) Applicant: Mitsubishi Electric Corporation, Tokyo (JP)

(72) Inventors: Shinya Soneda, Tokyo (JP); Kenji Harada, Tokyo (JP); Kakeru Otsuka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 17 days.

(21) Appl. No.: 17/168,750

(22) Filed: Feb. 5, 2021

(65) Prior Publication Data

US 2021/0376167 A1    Dec. 2, 2021

(30) Foreign Application Priority Data

May 27, 2020 (JP) .................. 2020-092235

(51) Int. Cl.
*H01L 29/861* (2006.01)
*H01L 27/06* (2006.01)
*H01L 29/04* (2006.01)

(52) U.S. Cl.
CPC ........ *H01L 29/861* (2013.01); *H01L 27/0676* (2013.01); *H01L 29/045* (2013.01)

(58) Field of Classification Search
CPC ............. H01L 29/7395; H01L 29/7396; H01L 29/861
See application file for complete search history.

(56) References Cited

U.S. PATENT DOCUMENTS

2012/0132955 A1    5/2012 Saito et al.
2016/0254264 A1*   9/2016 Mizushima ....... H01L 29/66348
                                               438/138

(Continued)

FOREIGN PATENT DOCUMENTS

CN    105830217 A    8/2016
CN    110546767 A    12/2019

(Continued)

OTHER PUBLICATIONS

An Office Action; "Notice of Reasons for Refusal," mailed by the Japanese Patent Office on Jun. 20, 2023, which corresponds to Japanese Patent Application No. 2020-092235 and is related to U.S. Appl. No. 17/168,750; with English language translation.

(Continued)

*Primary Examiner* — Tucker J Wright
(74) *Attorney, Agent, or Firm* — Studebaker & Brackett PC

(57) ABSTRACT

A semiconductor device includes a transistor and a diode formed at a common semiconductor substrate. The diode region includes: a fifth semiconductor layer of a second conductivity type; a second semiconductor layer of the second conductivity type provided on the fifth semiconductor layer; a third semiconductor layer of a first conductivity type provided closer to a first main surface of the semiconductor substrate; a sixth semiconductor layer of the first conductivity type provided on the third semiconductor layer; and a lifetime control layer formed of a crystal defect layer reaching a deeper position than an intermediate position of the second semiconductor layer between an end of the third semiconductor layer in a thickness direction as viewed from the first main surface and an end of the fifth semiconductor layer in a thickness direction as viewed from a second main surface.

3 Claims, 25 Drawing Sheets

(56) References Cited

U.S. PATENT DOCUMENTS

| | | | |
|---|---|---|---|
| 2016/0260807 A1 | 9/2016 | Soeno et al. | |
| 2016/0329323 A1* | 11/2016 | Iwasaki | H01L 27/0727 |
| 2017/0077216 A1 | 3/2017 | Kouno | |
| 2020/0058803 A1 | 2/2020 | Naito | |
| 2020/0161457 A1* | 5/2020 | Takahashi | H01L 29/861 |
| 2020/0357903 A1 | 11/2020 | Kubouchi | |
| 2024/0128359 A1 | 4/2024 | Kubouchi | |

FOREIGN PATENT DOCUMENTS

| | | |
|---|---|---|
| JP | 2011-216825 A | 10/2011 |
| JP | 2015-118991 A | 6/2015 |
| JP | 2016-162950 A | 9/2016 |
| WO | 2019/098270 A1 | 5/2019 |
| WO | 2020/036015 A1 | 2/2020 |

OTHER PUBLICATIONS

An Office Action mailed by China National Intellectual Property Administration on Jan. 31, 2024, which corresponds to Chinese Patent Application No. 202110559128.1 and is related to U.S. Appl. No. 17/168,750; with English language translation.

An Office Action mailed by the German Patent Office on Jun. 17, 2024, which corresponds to German Patent Application No. 10 2021 107 989.6 and is related to U.S. Appl. No. 17/168,750.

* cited by examiner

F I G. 8
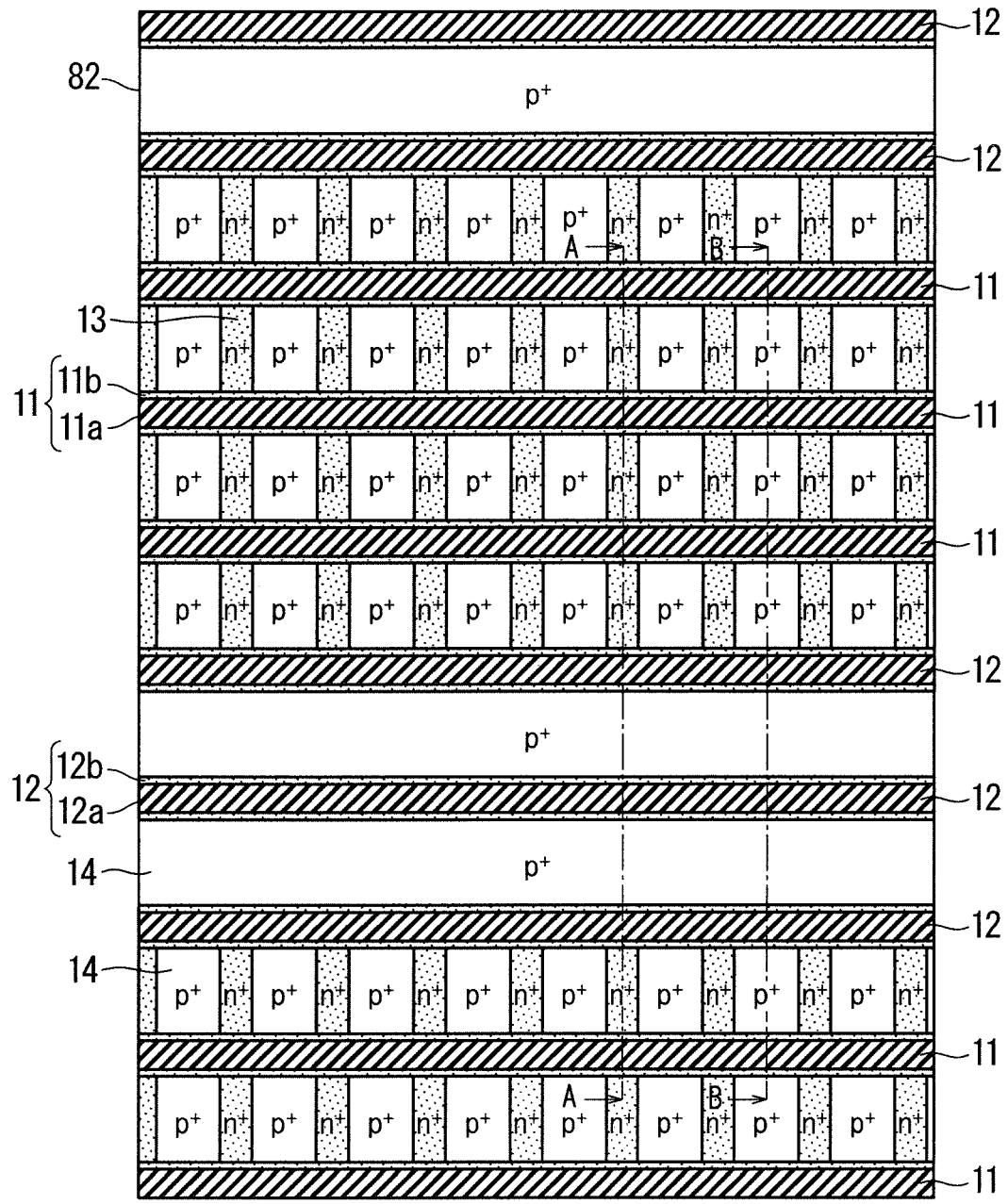

RC-IGBT WITH LIFETIME CONTROL LAYER

BACKGROUND OF THE INVENTION

Field of the Invention

The present disclosure relates to a semiconductor device, particularly, to a reverse conducting semiconductor device.

Description of the Background Art

A reverse conducting insulated gate bipolar transistor (RC-IGBT) is a semiconductor device including an insulated gate bipolar transistor (IGBT) and a free wheeling diode (FWD) formed at a common semiconductor substrate.

Referring to an RC-IGBT disclosed in Japanese Patent Application Laid-Open No. 2011-216825, for example, for reduction in recovery current, lifetime is controlled locally by implanting light ions into a region directly below a p-type anode.

In the RC-IGBT, current density is set high for the free wheeling diode. As a result of formation of a lifetime control layer through implantation of the light ions into the region directly below the p-type anode for the purpose of the local lifetime control, carriers are generated in large quantities during transition operation in a region from an intermediate position of a drift layer toward a back surface to cause difficulty in extending a depletion layer. As a result, an avalanche current is generated during recovery operation to cause a problem of reducing recovery breakdown tolerance.

SUMMARY

The present disclosure is intended to provide an RC-IGBT in which avalanche operation is suppressed during recovery operation to improve recovery breakdown tolerance.

A semiconductor device according to the present disclosure is a semiconductor device including a transistor and a diode formed at a common semiconductor substrate. The semiconductor substrate includes: a transistor region in which the transistor is formed; and a diode region in which the diode is formed. The transistor region includes: a first semiconductor layer of a first conductivity type provided on the side of a second main surface of the semiconductor substrate; a second semiconductor layer of a second conductivity type provided on the first semiconductor layer; a third semiconductor layer of the first conductivity type provided closer to a first main surface of the semiconductor substrate than the second semiconductor layer; a fourth semiconductor layer of the second conductivity type provided on the third semiconductor layer; a second electrode electrically connected to the fourth semiconductor layer; and a first electrode electrically connected to the first semiconductor layer. The diode region includes: a fifth semiconductor layer of the second conductivity type provided on the side of the second main surface of the semiconductor substrate; the second semiconductor layer provided on the fifth semiconductor layer; the third semiconductor layer provided closer to the first main surface of the semiconductor substrate than the second semiconductor layer; a sixth semiconductor layer of the first conductivity type provided on the third semiconductor layer; the second electrode electrically connected to the sixth semiconductor layer; the first electrode electrically connected to the fifth semiconductor layer; and a lifetime control layer formed of a crystal defect layer reaching a deeper position than an intermediate position of the second semiconductor layer between an end of the third semiconductor layer in a thickness direction as viewed from the first main surface and an end of the fifth semiconductor layer in a thickness direction as viewed from the second main surface.

The semiconductor device described above includes the lifetime control layer formed of the crystal defect layer reaching a deeper position than the intermediate position of the second semiconductor layer between the end of the third semiconductor layer in the thickness direction as viewed from the first main surface and the end of the fifth semiconductor layer in the thickness direction as viewed from the second main surface. This allows reduction in carriers stored in a part closer to the second main surface than the intermediate position of the second semiconductor layer during forward operation, thereby causing a depletion layer to extend easily during recovery operation of the diode and suppressing avalanche operation in the diode region to achieve improvement of recovery breakdown tolerance.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 8 is a partial plan view of an IGBT in the RC-IGBT according to the first preferred embodiment;

DESCRIPTION OF THE PREFERRED EMBODIMENTS

Introduction

Figure 1:
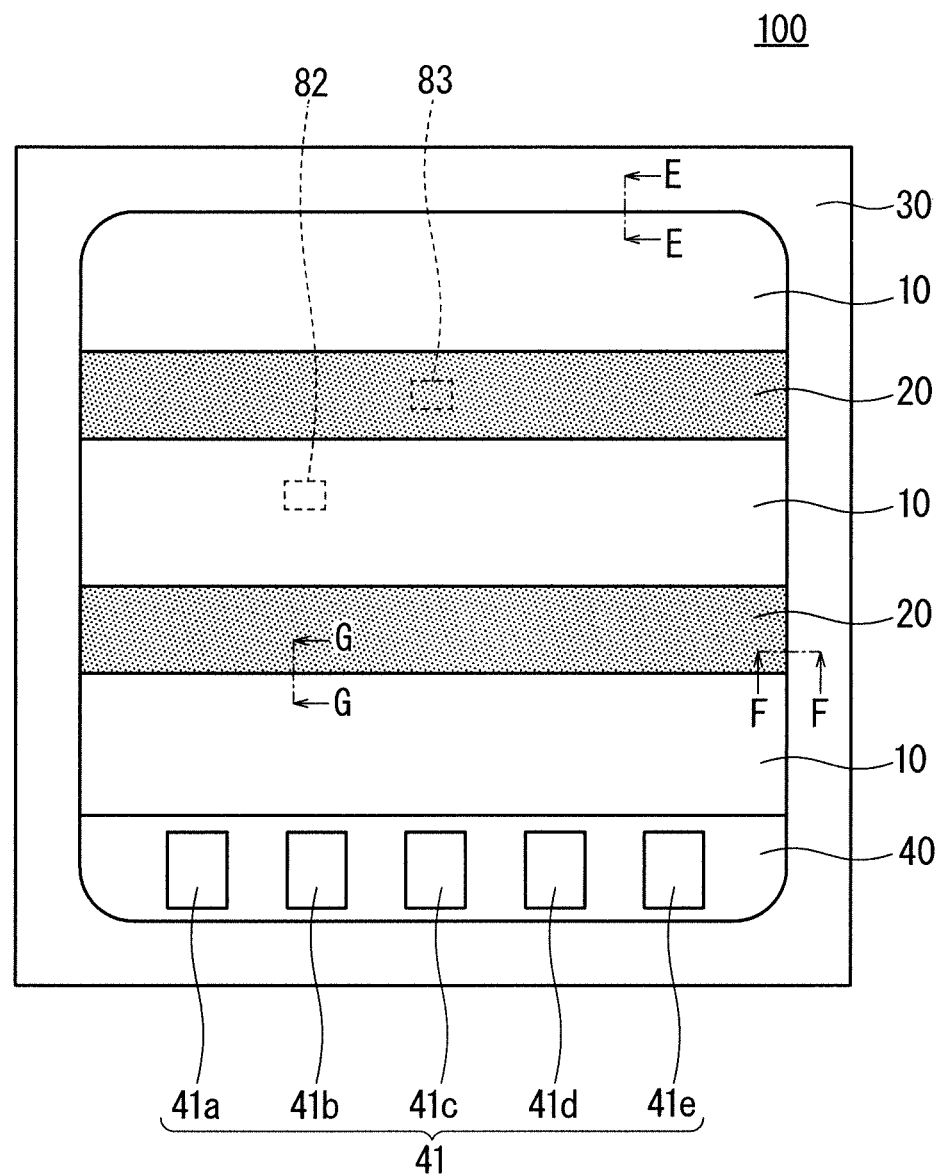
FIG. 1 is a plan view showing an RC-IGBT according to a first preferred embodiment.

In the following description, an n-type and a p-type show conductivity types of semiconductor, and the present disclosure is described on the assumption that a first conductivity type corresponds to the p-type and a second conductivity type corresponds to the n-type. Alternatively, the first conductivity type may correspond to the n-type and the second conductivity type may correspond to the p-type. Further, an n$^-$-type shows a lower impurity concentration than the n-type, and an n$^+$-type shows a higher impurity concentration than the n-type. Likewise, a p$^-$-type shows a lower impurity concentration than the p-type, and a p$^+$-type shows a higher impurity concentration than the p-type.

The drawings are shown as schematic drawings. The sizes and positions of images relative to each other shown in different drawings are not always illustrated correctly but can be changed, if appropriate. In the following description, similar constituting elements with the same sign illustrated in the drawings are given the same name and have the same function. Thus, in some cases, detailed description of these elements will be omitted.

Some parts of the following description include terms indicating particular positions and directions such as "upper," "lower," "side," "front," and "back." These terms are used for the sake of convenience for facilitating understanding of the content of a preferred embodiment and do not relate to directions during actual implementation of the preferred embodiment.

First Preferred Embodiment

Figure 2:
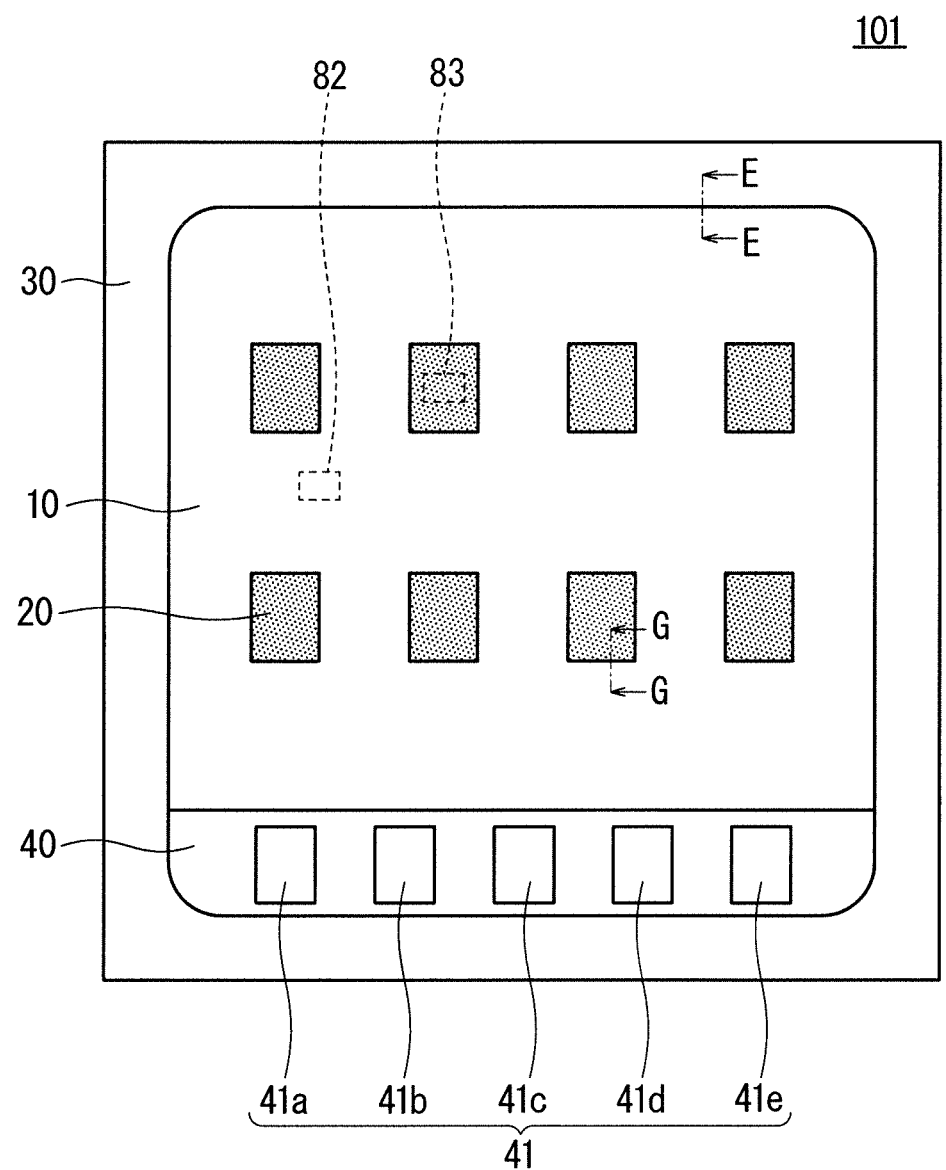
FIG. 2 is a plan view showing the RC-IGBT according to the first preferred embodiment.

FIG. 1 is a plan view showing a semiconductor device 100 that is a reverse conducting insulated gate bipolar transistor (RC-IGBT) according to a first preferred embodiment. FIG. 2 is a plan view showing a semiconductor device 101 that is an RC-IGBT of a different configuration according to the first preferred embodiment. In the semiconductor device 100 shown in FIG. 1, IGBT regions 10 and diode regions 20 like stripes are arranged side by side, and this may simply be called a "stripe pattern." In the semiconductor device 101 shown in FIG. 2, a plurality of diode regions 20 is arranged in the vertical direction and the horizontal direction and an IGBT region 10 is provided around the diode regions 20, and this may simply be called an "island pattern."

<Overall Planar Configuration of Stripe Pattern>

In FIG. 1, the semiconductor device 100 includes the IGBT regions 10 and the diode regions 20 in one semiconductor device. The IGBT regions 10 and the diode regions 20 extend from one end toward the other end of the semiconductor device 100, and are arranged alternately like stripes in a direction orthogonal to a direction in which the IGBT regions 10 and the diode regions 20 extend. In the configuration of FIG. 1, three IGBT regions 10 and two diode regions 20 are shown and all the diode regions 20 are sandwiched between the IGBT regions 10. However, the number of the IGBT regions 10 and that of the diode regions 20 are not limited to these. The number of the IGBT regions 10 may be equal to or greater than three, or equal to or less than three. Also, the number of the diode regions 20 may be equal to or greater than two, or equal to or less than two. In the configuration of FIG. 1, the position of the IGBT region 10 and that of the diode region 20 may be switched to each other, or all the IGBT regions 10 may be sandwiched between the diode regions 20. The configuration may also be such that one IGBT region 10 and one diode region 20 are arranged adjacent to each other.

As shown in FIG. 1, a pad region 40 is provided adjacent to the IGBT region 10 in a lower part of the plane of the drawing. The pad region 40 is a region in which a control pad 41 for controlling the semiconductor device 100 is provided. The IGBT region 10 and the diode region 20 are collectively called a cell region. A terminal region 30 for retaining the breakdown voltage of the semiconductor device 100 is provided around a region including the cell region and the pad region 40. The terminal region 30 may be provided by selecting a well-known breakdown voltage retaining structure appropriately. The breakdown voltage retaining structure may be configured by providing a field limiting ring (FLR) using a p-type terminal well layer made of p-type semiconductor to surround the cell region and providing variation of lateral doping (VLD) using a p-type well layer given a concentration gradient to surround the cell region on the side of a first main surface corresponding to the front surface of the semiconductor device 100, for example. The number of the ring-like p-type terminal well layers used for the FLR and a concentration distribution used in the VLD may be selected appropriately depending on breakdown voltage design for the semiconductor device 100. The p-type terminal well layer may be provided to extend substantially entirely over the pad region 40. Further, an IGBT cell and a diode cell may be provided in the pad region 40.

The control pad 41 may be a current sense pad 41$a$, a kelvin emitter pad 41$b$, a gate pad 41$c$, and a temperature sense diode pad 41$d$ and a temperature sense diode pad 41$e$, for example. The current sense pad 41$a$ is a control pad for sensing a current flowing in the cell region of the semiconductor device 100. This control pad is electrically connected to some of the IGBT cells or diode cells in the cell region in such a manner that, when a current flows in the cell region of the semiconductor device 100, a current in a range from a fraction of the current flowing in the cell region entirely to a few tens of thousands smaller than this current is to flow into the control pad.

The kelvin emitter pad 41$b$ and the gate pad 41$c$ are control pads to which a gate driving voltage for controlling on-off of the semiconductor device 100 is to be applied. The kelvin emitter pad 41$b$ is electrically connected to a p-type base layer of the IGBT cell. The gate pad 41$c$ is electrically connected to a gate trench electrode of the IGBT cell. The kelvin emitter pad 41$b$ and the p-type base layer may electrically be connected to each other through a p$^+$-type contact layer. The temperature sense diode pads 41$d$ and 41$e$ are control pads electrically connected to an anode and a cathode of a temperature sense diode respectively provided at the semiconductor device 100. The temperature sense diode pads 41$d$ and 41$e$ measure the temperature of the semiconductor device 100 by measuring a voltage between the anode and the cathode of the temperature sense diode not shown in the drawings provided in the cell region.

<Overall Planar Configuration of Island Pattern>

In FIG. 2, the semiconductor device 101 includes the IGBT region 10 and the diode region 20 in one semiconductor device. The diode region 20 includes a plurality of the diode regions 20 arranged side by side in each of the vertical direction and the horizontal direction in the semiconductor device in a plan view. The diode region 20 is surrounded by the IGBT region 10. That is, a plurality of the diode regions 20 is arranged in an island pattern in the IGBT region 10. In FIG. 2, the diode region 20 has a matrix configuration with four columns arranged in the right-to-left direction in the plane of the drawing and two rows arranged in the top-to-bottom direction in the plane of the drawing. However, the number of the diode regions 20 and the arrangement thereof are not limited to these. As long as one or a plurality of the diode regions 20 is provided separately in the IGBT region 10 and each diode region 20 is surrounded by the IGBT region 10, any configuration is applicable.

As shown in FIG. 2, a pad region 40 is provided adjacent to the IGBT region 10 in a lower part of the plane of the drawing. The pad region 40 is a region in which a control pad 41 for controlling the semiconductor device 101 is provided. The IGBT region 10 and the diode region 20 are collectively called a cell region. A terminal region 30 for retaining the breakdown voltage of the semiconductor device 101 is provided around a region including the cell region and the pad region 40. The terminal region 30 may be provided by selecting a well-known breakdown voltage retaining structure appropriately. The breakdown voltage retaining structure may be configured by providing a field limiting ring (FLR) using a p-type terminal well layer made of p-type semiconductor to surround a region including the cell region and the pad region 40 and providing variation of lateral doping (VLD) using a p-type well layer given a concentration gradient to surround the cell region on the side of a first main surface corresponding to the front surface of the semiconductor device 101, for example. The number of the ring-like p-type terminal well layers used for the FLR and a concentration distribution used in the VLD may be selected appropriately depending on breakdown voltage design for the semiconductor device 101. The p-type terminal well layer may be provided to extend substantially entirely over the pad region 40. Further, an IGBT cell and a diode cell may be provided in the pad region 40.

The control pad 41 may be a current sense pad 41a, a kelvin emitter pad 41b, a gate pad 41c, and a temperature sense diode pad 41d and a temperature sense diode pad 41e, for example. The current sense pad 41a is a control pad for sensing a current flowing in the cell region of the semiconductor device 101. This control pad is electrically connected to some of the IGBT cells or diode cells in the cell region in such a manner that, when a current flows in the cell region of the semiconductor device 101, a current in a range from a fraction of the current flowing in the cell region entirely to a few tens of thousands smaller than this current is to flow into the control pad.

The kelvin emitter pad 41b and the gate pad 41c are control pads to which a gate driving voltage for controlling on-off of the semiconductor device 101 is to be applied. The kelvin emitter pad 41b is electrically connected to a p-type base layer and an n$^+$-type source layer of the IGBT cell. The gate pad 41c is electrically connected to a gate trench electrode of the IGBT cell. The kelvin emitter pad 41b and the p-type base layer may electrically be connected to each other through a p$^+$-type contact layer. The temperature sense diode pads 41d and 41e are control pads electrically connected to an anode and a cathode of a temperature sense diode respectively provided at the semiconductor device 101. The temperature sense diode pads 41d and 41e measure the temperature of the semiconductor device 101 by measuring a voltage between the anode and the cathode of the temperature sense diode not shown in the drawings provided in the cell region.

<Cross-Sectional Configuration>

Figure 3:
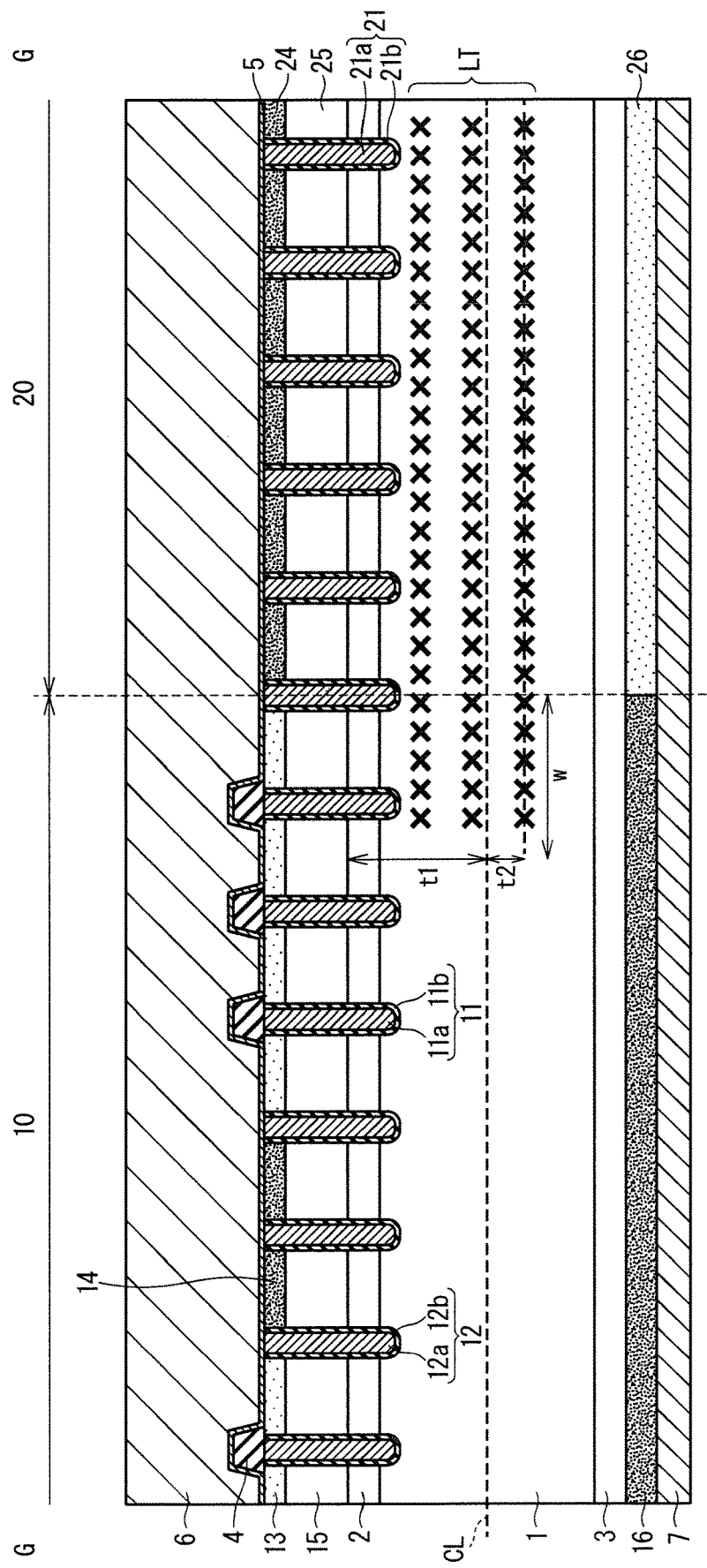
FIG. 3 is a cross-sectional view of a boundary part between an IGBT region and a diode region in the RC-IGBT according to the first preferred embodiment.

FIG. 3 is a cross-sectional view taken in a direction of arrows along a line G-G indicated in the semiconductor device 100 shown in FIG. 1 or in the semiconductor device 101 shown in FIG. 2. This cross-sectional view shows a configuration at a boundary part between the IGBT region 10 and the diode region 20.

As shown in FIG. 3, the semiconductor device 100 or 101 includes an n$^-$-type drift layer 1 (second semiconductor layer) formed of a semiconductor substrate. The n$^-$-type drift layer 1 is a semiconductor layer containing arsenic (As) or phosphorus (P) as n-type impurity, for example, and having an n-type impurity concentration from $1.0 \times 10^{12}$ to $1.0 \times 10^{15}/\text{cm}^3$. In the IGBT region 10, the semiconductor substrate covers a range from an n$^-$-type source layer 13 (fourth semiconductor layer) and a p$^+$-type contact layer 14 to a p-type collector layer 16 (first semiconductor layer). In the diode region 20, the semiconductor substrate covers a range from a p$^+$-type contact layer 24 (sixth semiconductor layer) to an n$^+$-type cathode layer 26 (fifth semiconductor layer).

In FIG. 3, the upper end of the n$^+$-type source layer 13 and that of the p$^+$-type contact layer 14 in the IGBT region 10 in the plane of the drawing will be called a first main surface of the semiconductor substrate, and the lower end of the p-type collector layer 16 in the IGBT region 10 in the plane of the drawing will be called a second main surface of the semiconductor substrate. In FIG. 3, the upper end of the p$^+$-type contact layer 24 in the diode region 20 in the plane of the drawing will be called a first main surface of the semiconductor substrate, and the lower end of the n$^+$-type cathode layer 26 in the diode region 20 in the plane of the drawing will be called a second main surface of the semiconductor substrate. The first main surface in the diode region 20 and the first main surface in the IGBT region 10 are on the same plane. The second main surface in the diode region 20 and the second main surface in the IGBT region 10 are on the same plane.

The first main surface of the semiconductor substrate is a main surface corresponding to the front surface of the semiconductor device 100 or 101. The second main surface of the semiconductor substrate is a main surface corresponding to the back surface of the semiconductor device 100 or 101. In the IGBT region 10 as the cell region, the semiconductor device 100 or 101 includes the n$^-$-type drift layer 1 between the first main surface and the second main surface facing the first main surface. In the diode region 20, the semiconductor device 100 or 101 also includes the n$^-$-type drift layer 1 formed of the same semiconductor substrate as in the IGBT region 10. The n$^-$-type drift layer 1 in the diode region 20 and the n$^-$-type drift layer 1 in the IGBT region 10 are formed continuously and integrally using the same semiconductor substrate.

As shown in FIG. 3, in the IGBT region 10, an n-type carrier stored layer 2 higher in n-type impurity concentration than the n$^-$-type drift layer 1 is provided on the n$^-$-type drift layer 1 to be closer to the first main surface. The n-type carrier stored layer 2 is a semiconductor layer containing arsenic (As) or phosphorus (P) as n-type impurity, for example, and having an n-type impurity concentration from $1.0 \times 10^{13}$ to $1.0 \times 10^{17}/cm^3$. In the configuration of each of the semiconductor devices 100 and 101, the n-type carrier stored layer 2 may be omitted and the n⁻-type drift layer 1 may be provided further in a region of the n-type carrier stored layer 2. Providing the n-type carrier stored layer 2 allows reduction in conduction loss to be caused when a current flows in the IGBT region 10. The n-type carrier stored layer 2 and the n⁻-type drift layer 1 may also be called a drift layer collectively.

The n-type carrier stored layer 2 is formed by ion-implanting n-type impurity into the semiconductor substrate forming the n⁻-type drift layer 1, and then diffusing the implanted n-type impurity by annealing into the semiconductor substrate corresponding to the n⁻-type drift layer 1.

A p-type base layer 15 (third semiconductor layer) is provided on the n-type carrier stored layer 2 to be closer to the first main surface. The p-type base layer 15 is a semiconductor layer containing boron (B) or aluminum (Al) as p-type impurity, for example, and having a p-type impurity concentration from $1.0 \times 10^{12}$ to $1.0 \times 10^{19}/cm^3$. The p-type base layer 15 contacts a gate trench insulating film 11b of an active trench gate 11. In a region on the p-type base layer 15 and closer to the first main surface, the n⁺-type source layer 13 is provided to contact the gate trench insulating film 11b of the active trench gate 11, and the p⁺-type contact layer 14 is provided in the remaining region. The n⁺-type source layer 13 and the p⁺-type contact layer 14 form the first main surface of the semiconductor substrate. The p⁺-type contact layer 14 is a region of a higher p-type impurity concentration than the p-type base layer 15. If the p⁺-type contact layer 14 and the p-type base layer 15 are required to be distinguished from each other, they may be referred to by their respective names. If the p⁺-type contact layer 14 and the p-type base layer 15 may also be called a p-type base layer collectively.

The semiconductor device 100 or 101 includes an n-type buffer layer 3 higher in n-type impurity concentration than the n⁻-type drift layer 1 and provided on the n⁻-type drift layer 1 to be closer to the second main surface. The n-type buffer layer 3 is provided for suppressing punch-through of a depletion layer to extend from the p-type base layer 15 toward the second main surface when the semiconductor device 100 or 101 is in an off state. The n-type buffer layer 3 may be formed by implanting phosphorus (P) or protons (H⁺), for example, or may be formed by implanting both phosphorus (P) and protons (H⁺). An n-type impurity concentration in the n-type buffer layer 3 is from $1.0 \times 10^{12}$ to $1.0 \times 10^{18}/cm^3$.

The configuration of the semiconductor device 100 or 101 may also be such that the n-type buffer layer 3 is omitted and the n⁻-type drift layer 1 extends further in a region of the n-type buffer layer 3. The n-type buffer layer 3 and the n⁻-type drift layer 1 may collectively be called a drift layer.

In the semiconductor device 100 or 101, the p-type collector layer 16 is provided on the n-type buffer layer 3 to be closer to the second main surface. Namely, the p-type collector layer 16 is provided between the n⁻-type drift layer 1 and the second main surface. The p-type collector layer 16 is a semiconductor layer containing boron (B) or aluminum (Al) as p-type impurity, for example, and having a p-type impurity concentration from $1.0 \times 10^{16}$ to $1.0 \times 10^{20}/cm^3$. The p-type collector layer 16 forms the second main surface of the semiconductor substrate. The p-type collector layer 16 is provided not only in the IGBT region 10 but also in the terminal region 30 not shown in FIG. 3. A part of the p-type collector layer 16 provided in the terminal region 30 forms a p-type terminal collector layer 16a.

As shown in FIG. 3, in the IGBT region 10, a trench starting from the first main surface of the semiconductor substrate is formed to reach the n⁻-type drift layer 1 while penetrating the p-type base layer 15. A gate trench electrode 11a is provided in the trench via the gate trench insulating film 11b to form the active trench gate 11. The gate trench electrode 11a faces the n⁻-type drift layer 1 via the gate trench insulating film 11b. A dummy trench electrode 12a is provided in a trench via a dummy trench insulating film 12b, thereby forming a dummy trench gate 12. The dummy trench electrode 12a faces the n⁻-type drift layer 1 via the dummy trench insulating film 12b. The gate trench insulating film 11b of the active trench gate 11 contacts the p-type base layer 15 and the n⁺-type source layer 13. In response to application of a gate driving voltage to the gate trench electrode 11a, a channel is formed in the p-type base layer 15 contacting the gate trench insulating film 11b of the active trench gate 11.

As shown in FIG. 3, an interlayer insulating film 4 is provided on the gate trench electrode 11a of the active trench gate 11. Barrier metal 5 is formed on a region of the first main surface of the semiconductor substrate in the absence of the interlayer insulating film 4 and on the interlayer insulating film 4. The barrier metal 5 may be a conductor containing titanium (Ti), for example, and may be titanium nitride or TiSi formed by alloying between titanium and silicon (Si), for example. As shown in FIG. 3, the barrier metal 5 ohmically contacts the n⁺-type source layer 13, the p⁺-type contact layer 14, and the dummy trench electrode 12a, and is electrically connected to the n⁺-type source layer 13, the p⁺-type contact layer 14, and the dummy trench electrode 12a. An emitter electrode 6 is provided on the barrier metal 5. The emitter electrode 6 may be made of an aluminum alloy such as an aluminum-silicon alloy (Al—Si based alloy), or may be an electrode including metallic films in multiple layers that are plated films formed by electroless plating or electrolytic plating on an electrode made of an aluminum alloy, for example. The plated films formed by electroless plating or electrolytic plating may be films plated with nickel (Ni), for example. If there is a fine region between interlayer insulating films 4 adjacent to each other, for example, and if it is impossible to embed this fine region favorably using the emitter electrode 6, tungsten (W) to fulfill more favorable embedding performance than the emitter electrode 6 may be provided in this fine region and the emitter electrode 6 may be provided on the tungsten. In another case, the emitter electrode 6 may be provided on the n⁺-type source layer 13, the p⁺-type contact layer 14, and the dummy trench electrode 12a without providing the barrier metal 5. Alternatively, the barrier metal 5 may be provided only on an n-type semiconductor layer such as the n⁺-type source layer 13. The barrier metal 5 and the emitter electrode 6 may collectively be called an emitter electrode. While the interlayer insulating film 4 is not provided on the dummy trench electrode 12a of the dummy trench gate 12 in FIG. 3, the interlayer insulating film 4 may be provided on the dummy trench electrode 12a of the dummy trench gate 12. In the presence of the interlayer insulating film 4 formed on the dummy trench electrode 12a of the dummy trench gate 12, electrical connection between the emitter electrode 6 and the dummy trench electrode 12a may be formed at a different cross section.

A collector electrode 7 (first electrode) is provided on the p-type collector layer 16 to be closer to the second main surface. Like the emitter electrode 6 (second electrode), the collector electrode 7 may be made of an aluminum alloy, or an aluminum alloy and a plated film. The collector electrode 7 may have a different configuration from the emitter electrode 6. The collector electrode 7 ohmically contacts the p-type collector layer 16 and is electrically connected to the p-type collector layer 16.

As shown in FIG. 3, like in the IGBT region 10, the n-type carrier stored layer 2 is provided on the n⁻-type drift layer 1 to be closer to the first main surface, and an n-type buffer layer 3 is provided on the n⁻-type drift layer 1 to be closer to the second main surface. The n-type carrier stored layer 2 and the n-type buffer layer 3 provided in the diode region 20 have configurations same as those of the n-type carrier stored layer 2 and the n-type buffer layer 3 respectively provided in the IGBT region 10. The n-type carrier stored layer 2 is not always required to be provided in the IGBT region 10 and the diode region 20. In one configuration, while the n-type carrier stored layer 2 is provided in the IGBT region 10, the n-type carrier stored layer 2 may be omitted from the diode region 20. Like in the IGBT region 10, the n⁻-type drift layer 1, the n-type carrier stored layer 2, and the n-type buffer layer 3 may collectively be called a drift layer.

A p-type anode layer 25 (third semiconductor layer) is provided on the n-type carrier stored layer 2 to be closer to the first main surface. The p-type anode layer 25 is provided between the n⁻-type drift layer 1 and the first main surface. A p-type impurity concentration in the p-type anode layer 25 may be set to be equal to that in the p-type base layer 15 in the IGBT region 10, and the p-type anode layer 25 and the p-type base layer 15 may be formed simultaneously. A p-type impurity concentration in the p-type anode layer 25 may be set to be lower than that in the p-type base layer 15 in the IGBT region 10, and the quantity of holes to be injected into the diode region 20 may be reduced during the operation of the diode. Reducing the quantity of holes to be injected during the operation of the diode achieves reduction in recovery loss occurring during the operation of the diode.

The p⁺-type contact layer 24 is provided on the p-type anode layer 25 to be closer to the first main surface. A p-type impurity concentration in the p⁺-type contact layer 24 may be set to be equal to or different from that in the p⁺-type contact layer 14 in the IGBT region 10. The p⁺-type contact layer 24 forms the first main surface of the semiconductor substrate. The p⁺-type contact layer 24 is a region of a higher p-type impurity concentration than the p-type anode layer 25. If the p⁺-type contact layer 24 and the p-type anode layer 25 are required to be distinguished from each other, they may be referred to by their respective names. The p⁺-type contact layer 24 and the p-type anode layer 25 may also be called a p-type anode layer collectively.

In the diode region 20, the n⁻-type cathode layer 26 is provided on the n-type buffer layer 3 to be closer to the second main surface. The n⁺-type cathode layer 26 is provided between the n⁻-type drift layer 1 and the second main surface. The n⁺-type cathode layer 26 is a semiconductor layer containing arsenic (As) or phosphorus (P) as n-type impurity, for example, and having an n-type impurity concentration from $1.0 \times 10^{16}$ to $1.0 \times 10^{21}/cm^3$.

The n⁺-type cathode layer 26 forms the second main surface of the semiconductor substrate. While not shown in FIG. 3, p-type impurity may further be implanted selectively into a region in which the n⁺-type cathode layer 26 is formed in the way described above to provide p-type semiconductor in a part of the region in which the n⁺-type cathode layer 26 is formed, and this p-type semiconductor may be used as a p⁺-type cathode layer. A diode with the n⁻-type cathode layer ands the p⁺-type cathode layer arranged alternately along the second main surface of the semiconductor substrate is called a relaxed field of cathode (RFC) diode.

As shown in FIG. 3, in the diode region 20, a trench starting from the first main surface of the semiconductor substrate is formed to reach the n⁻-type drift layer 1 while penetrating the p-type anode layer 25. A diode trench electrode 21a is provided in the trench in the diode region 20 via a diode trench insulating film 21b to form a diode trench gate 21. The diode trench electrode 21a faces the n⁻-type drift layer 1 via the diode trench insulating film 21b.

As shown in FIG. 3, the barrier metal 5 is provided on the diode trench electrode 21a and on the p⁺-type contact layer 24. The barrier metal 5 ohmically contacts the diode trench electrode 21a and the p⁺-type contact layer 24, and is electrically connected to the diode trench electrode 21a and the p⁺-type contact layer 24. The barrier metal 5 may have the same configuration as the barrier metal 5 in the IGBT region 10. An emitter electrode 6 is provided on the barrier metal 5. The emitter electrode 6 provided in the diode region 20 is formed continuously with the emitter electrode 6 provided in the IGBT region 10. Like in the IGBT region 10, the diode trench electrode 21a and the p⁺-type contact layer 24 may ohmically contact the emitter electrode 6 without providing the barrier metal 5. While the interlayer insulating film 4 is not provided on the diode trench electrode 21a of the diode trench gate 21 in FIG. 3, the interlayer insulating film 4 may be formed on the diode trench electrode 21a of the diode trench gate 21. In the presence of the interlayer insulating film 4 formed on the diode trench electrode 21a of the diode trench gate 21, electrical connection between the emitter electrode 6 and the diode trench electrode 21a may be formed at a different cross section.

The collector electrode 7 is provided on the n⁺-type cathode layer 26 to be closer to the second main surface. Like the emitter electrode 6, the collector electrode 7 in the diode region 20 is formed continuously with the collector electrode 7 provided in the IGBT region 10. The collector electrode 7 ohmically contacts the n⁺-type cathode layer 26 and is electrically connected to the n⁺-type cathode layer 26.

As shown in FIG. 3, in the diode region 20 in the semiconductor device 100 or 101, a lifetime control layer LT is formed to a deeper position than an intermediate position CL of the n⁻-type drift layer 1 between an end of the p-type anode layer 25 in a thickness direction as viewed from the first main surface and an end of the n⁺-type cathode layer 26 in a thickness direction as viewed from the second main surface.

The end of the p-type anode layer 25 in the thickness direction mentioned herein means a boundary between the n⁻-type drift layer 1 and the p-type anode layer 25. This boundary is not always a plane. In the present disclosure, a region to be determined as a boundary between the n⁻-type drift layer 1 and the p-type anode layer 25 can be a region in which, in comparison to n-type impurity having no concentration distribution or having a gentle concentration distribution, steep change occurs in the concentration of p-type impurity having a definite concentration distribution than the n-type impurity. Likewise, the end of the n⁺-type cathode layer 26 in the thickness direction mentioned herein means a boundary between the n-type buffer layer 3 and the n⁺-type cathode layer 26. While the boundary between the n-type buffer layer 3 and the n⁺-type cathode layer 26 is not always a plane, this boundary can be determined as there is a large concentration difference between the n-type buffer layer 3 and the n⁺-type cathode layer 26 so change in an impurity concentration can be understood easily.

The lifetime control layer LT is a crystal defect layer containing crystal defect formed by ion implantation of light ions such as helium or hydrogen ions, for example, and partially recovered by defect recovery annealing performed after the ion implantation. This layer is called a lifetime control layer as forming the crystal defect in the n⁻-type drift layer 1 allows reduction in the lifetime of carriers (holes) and controlling the density of the crystal defect allows control over the lifetime of the carriers. This layer may also be called a crystal defect control layer.

A region of the shortest lifetime in the lifetime control layer LT, namely, a region of the maximum crystal defect density is at a deeper position than the intermediate position CL of the n⁻-type drift layer 1 between the end of the p-type anode layer 25 in the thickness direction and the end of the n⁺-type cathode layer 26 in the thickness direction. The thickness of the n⁻-type drift layer 1 is from 40 to 700 μm, for example.

The lifetime control layer LT is provided not only in the n⁻-type drift layer 1 in the diode region 20 but is further provided to project into the n⁻-type drift layer 1 in the IGBT region 10 in a plane direction across a boundary between the diode region 20 and the IGBT region 10. This projecting part of the lifetime control layer LT in the plane direction has a width w, and the lifetime control layer LT extends further into the IGBT region 10 only by this width w.

The light ions for forming the lifetime control layer LT are implanted at an implantation dose from $1.0 \times 10^{10}$ to $1.0 \times 10^{12}$ ions/cm² in terms of surface density, for example, and at implantation energy from several megaelectronvolts to several tens of megaelectronvolts. The light ions are implanted while being accelerated by a cyclotron device, for example. The depth of implantation into the semiconductor device is adjusted by adjusting an acceleration voltage (implantation energy) or by using an absorber located in front of the semiconductor device. The light ions can be shielded by a metal mask or a thick resist to allow formation of the lifetime control layer LT only in a part of the IGBT region 10. After the ion implantation, defect recovery annealing is performed at a temperature from 200 to 450° C., for example.

Figure 4:
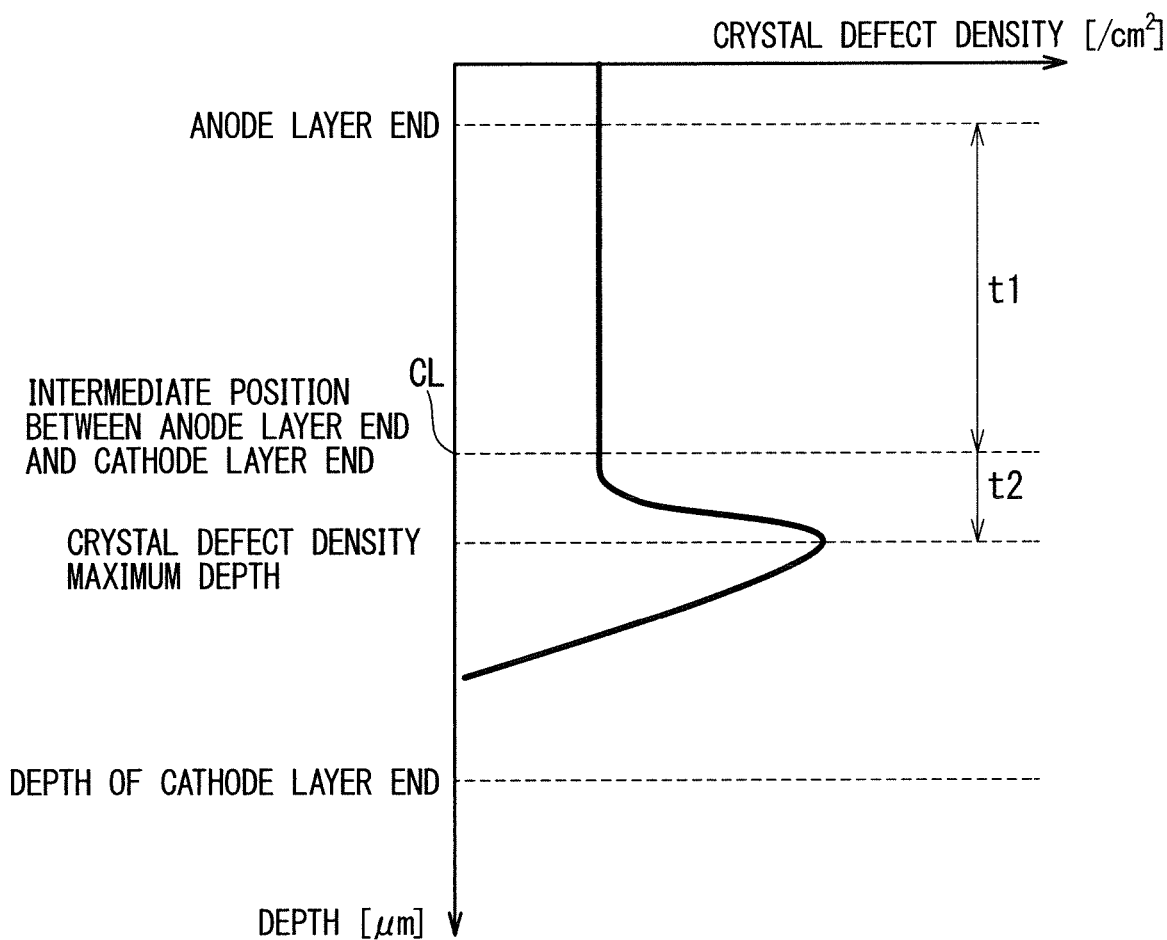
FIG. 4 shows a distribution of the density of crystal defect in a depth direction formed in a lifetime control layer in the RC-IGBT according to the first preferred embodiment.

FIG. 4 shows a distribution of the density of crystal defect in the depth direction formed in the lifetime control layer LT in the semiconductor substrate. A horizontal axis shows crystal defect density [/cm²] and a vertical axis shows a depth [μm] from the first main surface of the semiconductor substrate.

As the lifetime control layer LT is formed by ion-implanting the light ions from the side of the first main surface, crystal defect is formed in a region in which the light ions pass and a region in which the light ions stop. The density of the crystal defect is constant in the passing region including the p-type anode layer. By contrast, in the stopping region, the crystal defect increases suddenly to result in a steep peak and the shortest lifetime of carriers. A depth at which this peak of the crystal defect density is formed is called a crystal defect density maximum depth. The lifetime control layer LT is formed in such a manner that this depth comes to a deeper position than the intermediate position CL of the n⁻-type drift layer 1 between the end of the p-type anode layer 25 in the thickness direction (anode layer end) and the end of the n⁺-type cathode layer 26 in the thickness direction (cathode layer end). In other words, the lifetime control layer LT is formed in such a manner that the crystal defect density maximum depth comes to a deeper position than an intermediate position between the first main surface and the second main surface of the semiconductor substrate.

The crystal defect density maximum depth is set in a range from 30 to 600 μm, for example.

Figure 5:
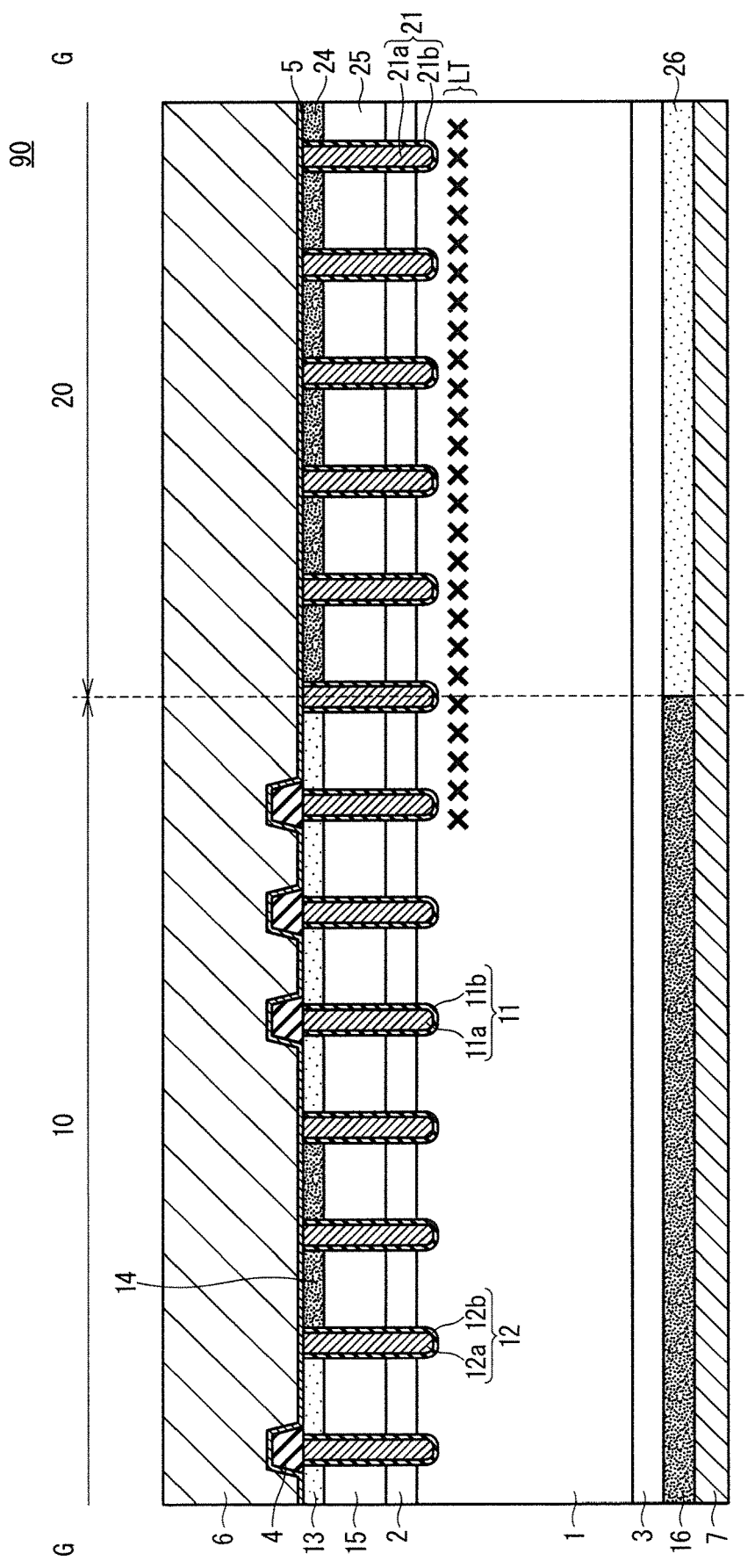
FIG. 5 is a cross-sectional view showing a comparative example in comparison to the RC-IGBT according to the first preferred embodiment.

FIG. 5 is a cross-sectional view of a semiconductor device 90 as a comparative example in comparison to the semiconductor device 100 or 101 according to the first preferred embodiment. The plan view of the semiconductor device 90 is similar to that of the semiconductor device 100 shown in FIG. 1 or that of the semiconductor device 101 shown in FIG. 2. A structure in FIG. 5 corresponding to the structure of the semiconductor device 100 or 101 described by referring to FIG. 3 is given the same sign, and description overlapping between the corresponding structures will be omitted.

In the semiconductor device 90 shown in FIG. 5, the lifetime control layer LT is provided only in an upper layer part of the n⁻-type drift layer 1, namely, only at a position relatively close to the n-type carrier stored layer 2.

Figure 6:
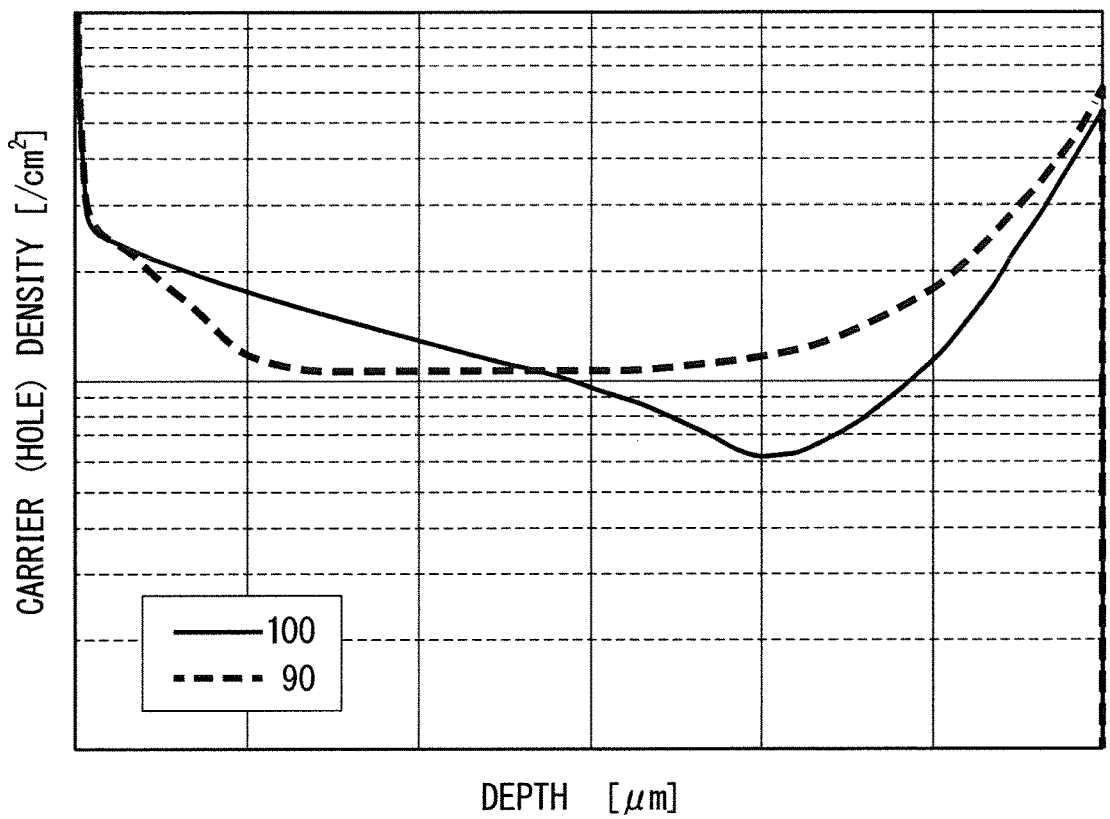
FIG. 6 shows a distribution of carrier density during forward operation of a diode in each of the RC-IGBT according to the first preferred embodiment and the comparative example.

FIG. 6 shows a distribution of carrier (hole) density during forward operation of the diode in the diode region 20 in each of the semiconductor device 90 according to the comparative example and the semiconductor device 100 according to the first preferred embodiment calculated by simulation. In FIG. 6, a horizontal axis shows a depth [μm] from the first main surface of the semiconductor substrate, and a vertical axis shows carrier (hole) density [/cm²]. A solid line shows the distribution of the semiconductor device 100 according to the first preferred embodiment. A dashed line shows the distribution of the semiconductor device 90 according to the comparative example.

It can be seen that, in the configuration of the semiconductor device 90 according to the comparative example, carrier density is comparatively constant in a central part and around the central part of the drift layer, and carriers increase from the central part toward the cathode layer (back surface side) at the right end of the drawing. By contrast, in the configuration of the semiconductor device 100 according to the first preferred embodiment, carriers decrease from the side of the anode layer (front surface side) at the left end of the drawing. In a part exceeding a central part of the drift layer, the quantity of carriers becomes smaller than that at the central part of the drift layer.

This result is achieved by providing a region in which crystal defect is increased suddenly by implantation of the light ions so lifetime becomes shortest, namely, by providing a region of the maximum crystal defect density at a greater depth than the intermediate position CL of the n⁻-type drift layer 1 between the anode layer end of the p-type anode layer 25 and the cathode layer end of the n⁺-type cathode layer 26. This result shows that carrier density can become lower on the back surface side than carrier density at the central part of the n⁻-type drift layer 1.

Figure 7:
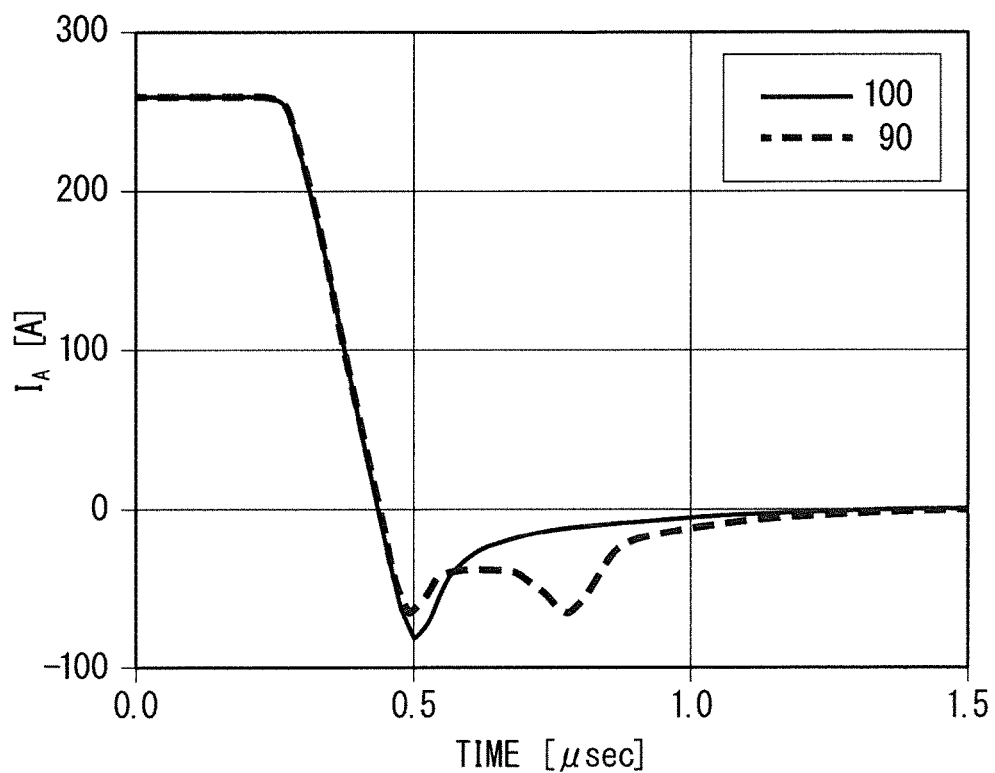
FIG. 7 shows a recovery waveform of the diode in each of the RC-IGBT according to the first preferred embodiment and the comparative example.

FIG. 7 shows a recovery waveform of the diode in the diode region 20 in each of the semiconductor device 90 according to the comparative example and the semiconductor device 100 according to the first preferred embodiment calculated by simulation. In FIG. 7, a horizontal axis shows time [usec], and a vertical axis shows an anode current $I_A$ [A]. A solid line shows the recovery waveform of the semiconductor device 100 according to the first preferred embodiment. A dashed line shows the recovery waveform of the semiconductor device 90 according to the comparative example.

In the configuration of the semiconductor device 90 according to the comparative example, a second peak in a recovery current is generated during recovery operation. This is an avalanche current resulting from high electric field generated during the recovery operation, and the high second peak in the recovery current causes reduction in recovery breakdown tolerance. By contrast, in the configuration of the semiconductor device 100 according to the first preferred embodiment, a second peak is not generated in a recovery current. As shown in FIG. 6, in the part exceeding the central part of the drift layer, carrier density becomes lower than that at the central part of the drift layer. This causes a depletion layer to extend more easily in the drift layer than in the semiconductor device 90 according to the comparative example to reduce electric field peak intensity, making it possible to suppress an avalanche current during the recovery operation. As a result, recovery breakdown tolerance is improved.

As described above by referring to FIGS. 3 and 4, while the lifetime control layer LT is formed to reach a deeper position than the intermediate position CL of the n⁻-type drift layer 1 between the anode layer end of the p-type anode layer 25 and the cathode layer end of the n⁻-type cathode layer 26, it does not reach the n⁺-type cathode layer 26. This configuration causes carriers to be stored positively in a place directly above the n⁺-type cathode layer 26 to achieve soft recovery by which a surge voltage to be caused by a recovery current is suppressed, thereby improving recovery breakdown tolerance.

As shown in FIG. 3, limitation is imposed on the projection of the lifetime control layer LT into the IGBT region 10, and the width of the projecting part is defined as w. As shown in FIGS. 3 and 4, with a thickness from the anode layer end to the intermediate position CL defined as t1 and a thickness from the intermediate position CL to a position of the crystal defect density maximum depth defined as t2, the width w of the projecting part is set so as to fulfill the following: $w > ((3 \times t1) - t2)/2$.

In the boundary part between the IGBT region 10 and the diode region 20, the projection of the lifetime control layer LT into the IGBT region 10 is provided in a region in which a current is to flow from the diode region 20 toward the outside of the diode region 20 during the forward operation of the diode. In a region in the absence of the lifetime control layer LT, namely, in a region between the lifetime control layer LT and the end of the n⁺-type cathode layer 26, the extension of the current in the horizontal direction (plane direction) is substantially equal to a range of this region in the depth direction. On the other hand, in a region in the presence of the lifetime control layer LT, the extension of the current in the horizontal direction becomes substantially equal to a half of the range of the lifetime control layer LT in the depth direction.

In view of the foregoing, the projecting width w of the lifetime control layer LT projecting into the IGBT region 10 is required to be greater than a total of the thickness of the n⁻-type drift layer 1 in the depth direction in a region in the absence of the lifetime control layer LT (t1−t2) and a half of the thickness of the n⁻-type drift layer 1 in the depth direction in a region in the presence of the lifetime control layer LT (t1+t2) (the half thickness is (t1+t2)/2). Thus, the following formula is defined: $w > (t1-t2) + (t1+t2)/2$. By deforming this formula, the following relationship is established: $w > ((3 \times t1) - t2)/2$. Limiting the projecting width w in such a manner as to fulfill this relationship allows reduction in switching loss in the IGBT region 10 while suppressing increase in ON voltage in the IGBT region 10 to be caused by the provision of the lifetime control layer LT. As a result, improvement of recovery breakdown tolerance and improvement of IGBT characteristics are achieved simultaneously.

<Configuration of IGBT Region>
<Partial Planar Configuration>

FIG. 8 is a partial plan view showing a region 82 in an enlarged manner that is a region surrounded by dashes in the IGBT region 10 in the semiconductor device 100 shown in FIG. 1 or the semiconductor device 101 shown in FIG. 2. As shown in FIG. 8, the active trench gates 11 and the dummy trench gates 12 are provided like stripes in the IGBT region 10. In the semiconductor device 100, the active trench gate 11 and the dummy trench gate 12 extend in the lengthwise direction of the IGBT region 10, and the lengthwise direction of the IGBT region 10 corresponds to the lengthwise direction of each of the active trench gate 11 and the dummy trench gate 12. In the semiconductor device 101, while there is no particular distinction between the lengthwise direction and the short-side direction of the IGBT region 10, the right-to-left direction in the plane of the drawing may be defined as the lengthwise direction of each of the active trench gate 11 and the dummy trench gate 12, or the top-to-bottom direction in the plane of the drawing may be defined as the lengthwise direction of each of the active trench gate 11 and the dummy trench gate 12.

The active trench gate 11 is formed by providing the gate trench electrode 11a in a trench formed in the semiconductor substrate via the gate trench insulating film 11b. The dummy trench gate 12 is formed by providing the dummy trench electrode 12a in a trench formed in the semiconductor substrate via the dummy trench insulating film 12b. The gate trench electrode 11a of the active trench gate 11 is electrically connected to the gate pad 41c (FIGS. 1 and 2). The dummy trench electrode 12a of the dummy trench gate 12 is electrically connected to the emitter electrode provided on the first main surface of the semiconductor device 100 or 101.

The n⁺-type source layer 13 is provided on the opposite sides of the active trench gate 11 as viewed in the width direction thereof to contact the gate trench insulating film 11b. The n⁺-type source layer 13 is a semiconductor layer containing arsenic (As) or phosphorus (P) as n-type impurity, for example, and having an n-type impurity concentration from $1.0 \times 10^{17}$ to $1.0 \times 10^{20}/\text{cm}^3$. The n⁺-type source layer 13 is formed alternately with the p⁺-type contact layer 14 in the direction in which the active trench gate 11 extends. The p⁺-type contact layer 14 is further provided between two dummy trench gates 12 adjacent to each other. The p⁺-type contact layer 14 is a semiconductor layer containing boron (B) or aluminum (Al) as p-type impurity, for example, and having a p-type impurity concentration from $1.0 \times 10^{15}$ to $1.0 \times 10^{20}/\text{cm}^3$.

As shown in FIG. 8, in the configuration of the IGBT region 10 in the semiconductor device 100 or 101, three active trench gates 11 are arranged side by side, three dummy trench gates 12 are arranged side by side next to these three active trench gates 11, and three active trench gates 11 are arranged side by side next to these three dummy trench gates 12. In this way, the IGBT region 10 has a configuration in which a set of the active trench gates 11 and a set of the dummy trench gates 12 are arranged alternately. In FIG. 8, while the number of the active trench gates 11 forming one set of the active trench gates 11 is three, any number of at least one is applicable. Also, the number of the dummy trench gates 12 forming one set of the dummy trench gates 12 may be at least one. The number of the dummy trench gate 12 may alternatively be zero. Namely, all trench gates provided in the IGBT region 10 may be the active trench gates 11.

<Partial Cross-Sectional Configuration>

Figure 9:
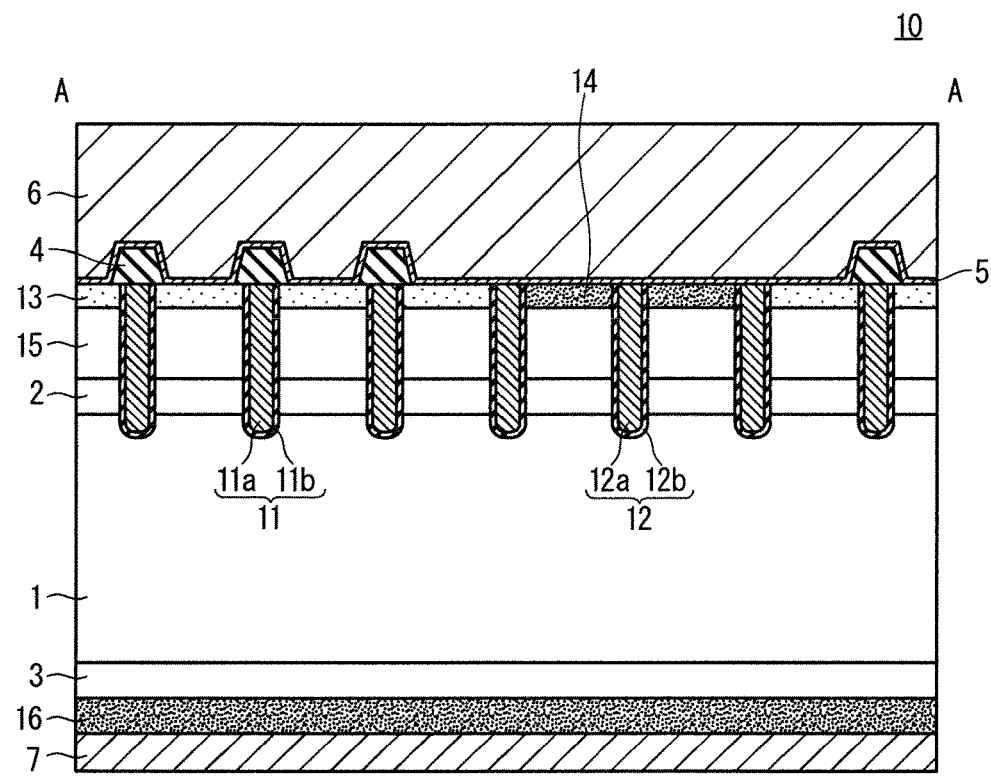
FIG. 9 is a partial cross-sectional view of the RC-IGBT according to the first preferred embodiment.

FIG. 9 is a cross-sectional view taken in a direction of arrows along a line A-A shown in FIG. 8. The cross-sectional configuration of the IGBT region 10 shown in FIG. 9 is basically the same as that of the IGBT region 10 shown in FIG. 3. A corresponding structure is given the same sign and description overlapping between the corresponding structures will be omitted. The cross-sectional configuration shown in FIG. 9 is not a configuration at the boundary part between the IGBT region 10 and the diode region 20, so that the projecting part of the lifetime control layer LT is not provided in the IGBT region 10.

Figure 10:
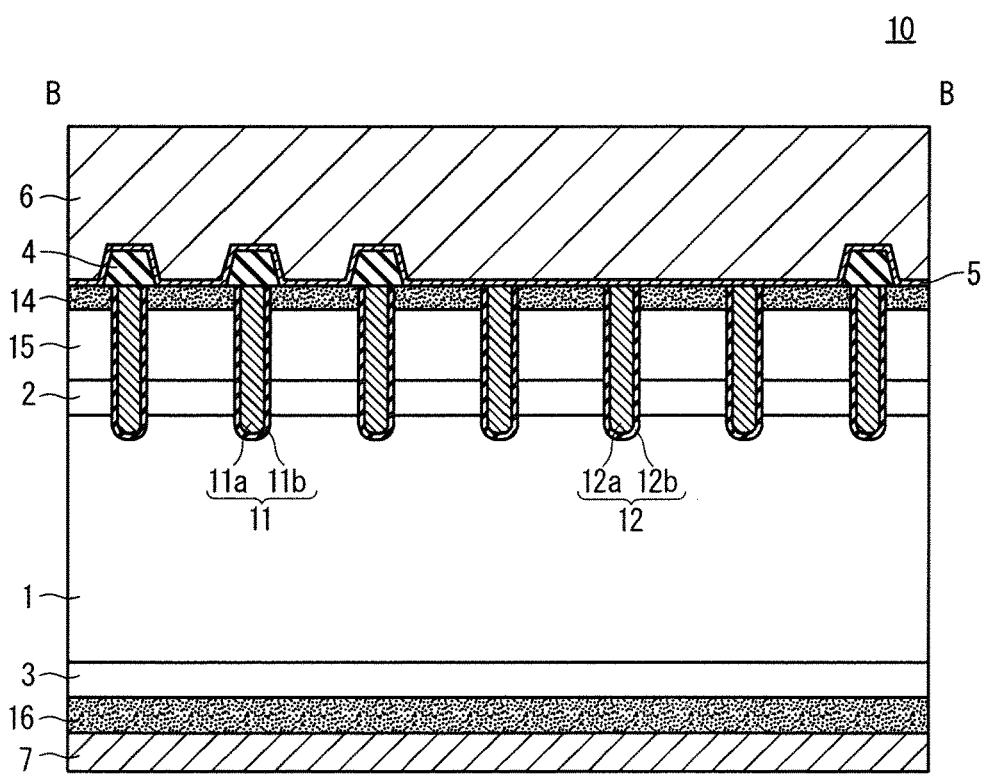
FIG. 10 is a partial cross-sectional view of the RC-IGBT according to the first preferred embodiment.

FIG. 10 is a cross-sectional view taken in a direction of arrows along a line B-B shown in FIG. 8. The cross-sectional configuration of the IGBT region 10 shown in FIG. 10 differs from that of FIG. 9 in that, as the cross-sectional configuration of FIG. 10 is determined in a direction in which the $p^+$-type contact layers 14 are arranged, all the layers formed on the p-type base layer 15 to be closer to the first main surface are the $p^+$-type contact layers 14 and the $n^+$-type source layer 13 is not observed on this side. Namely, as shown in FIG. 8, the $n^+$-type source layer 13 is formed selectively on the p-type base layer to be closer to the first main surface. The p-type base layer mentioned herein is a name indicating the p-type base layer 15 and the $p^+$-type contact layer 14 collectively.

Except for this point, the cross-sectional configuration of the IGBT region 10 shown in FIG. 10 is basically the same as the cross-sectional configuration of the IGBT region 10 shown in FIG. 3. A corresponding structure is given the same sign and description overlapping between the corresponding structures will be omitted. The cross-sectional configuration shown in FIG. 10 is not a configuration at the boundary part between the IGBT region 10 and the diode region 20, so that the projecting part of the lifetime control layer LT is not provided in the IGBT region 10.

<Configuration of Diode Region>
<Partial Planar Configuration>

Figure 11:
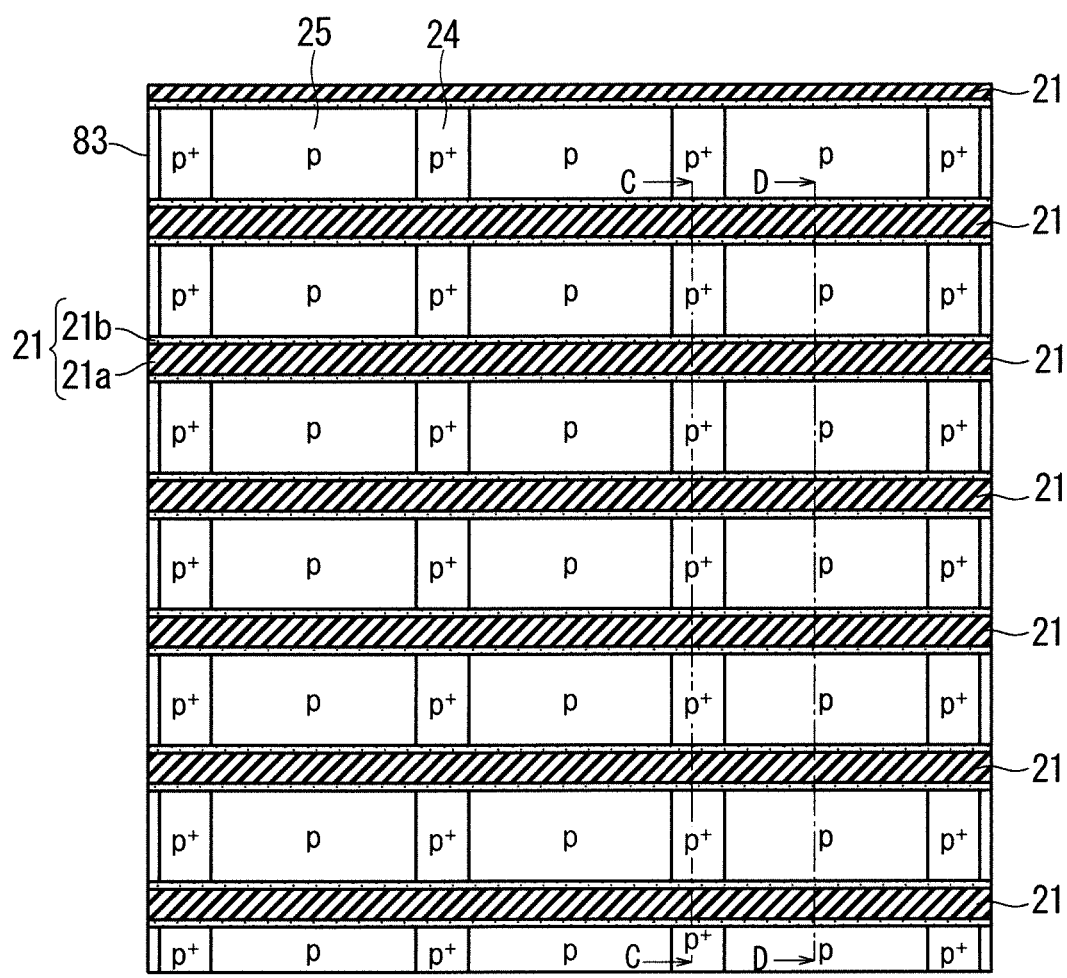
FIG. 11 is a partial plan view of the IGBT in the RC-IGBT according to the first preferred embodiment.

FIG. 11 is a partial plan view showing a region 83 in an enlarged manner that is a region surrounded by dashes in the diode region 20 in the semiconductor device 100 shown in FIG. 1 or the semiconductor device 101 shown in FIG. 2. As shown in FIG. 11, in the diode region 20, the diode trench gate 21 extends along the first main surface of the semiconductor device 100 or 101 from one end toward the other end of the diode region 20 as the cell region. The diode trench gate 21 is formed by providing the diode trench electrode 21a in a trench formed in the semiconductor substrate in the diode region 20 via the diode trench insulating film 21b. The diode trench electrode 21a faces the $n^-$-type drift layer 1 via the diode trench insulating film 21b. The $p^+$-type contact layer 24 and the p-type anode layer 25 are provided between two diode trench gates 21 adjacent to each other.

The $p^+$-type contact layer 24 is a semiconductor layer containing boron (B) or aluminum (Al) as p-type impurity, for example, and having a p-type impurity concentration from $1.0 \times 10^{15}$ to $1.0 \times 10^{20}/cm^3$. The p-type anode layer 25 is a semiconductor layer containing boron or aluminum as p-type impurity, for example, and having a p-type impurity concentration from $1.0 \times 10^{12}$ to $1.0 \times 10^{19}/cm^3$. The $p^+$-type contact layer 24 and the p-type anode layer 25 are arranged alternately in the lengthwise direction of the diode trench gate 21.

<Partial Cross-Sectional Configuration>

Figure 12:
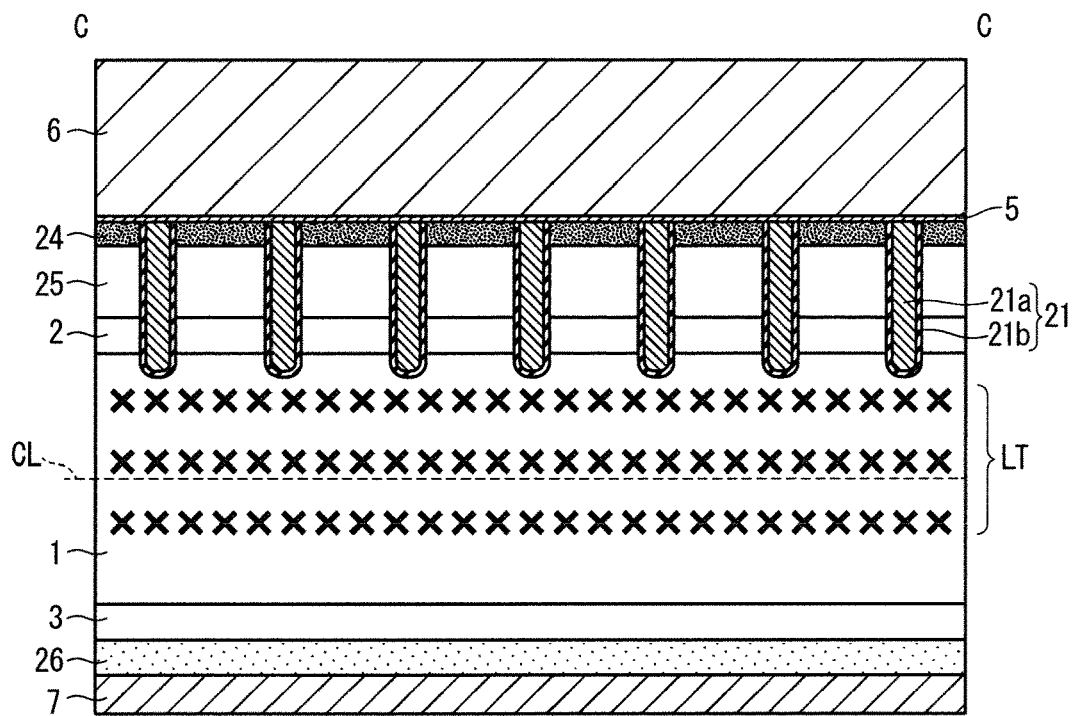
FIG. 12 is a partial cross-sectional view of the RC-IGBT according to the first preferred embodiment.

FIG. 12 is a cross-sectional view taken in a direction of arrows along a line C-C shown in FIG. 11. The cross-sectional configuration of the diode region 20 shown in FIG. 12 is the same as that of the diode region 20 shown in FIG. 3. A corresponding structure is given the same sign and description overlapping between the corresponding structures will be omitted.

Figure 13:
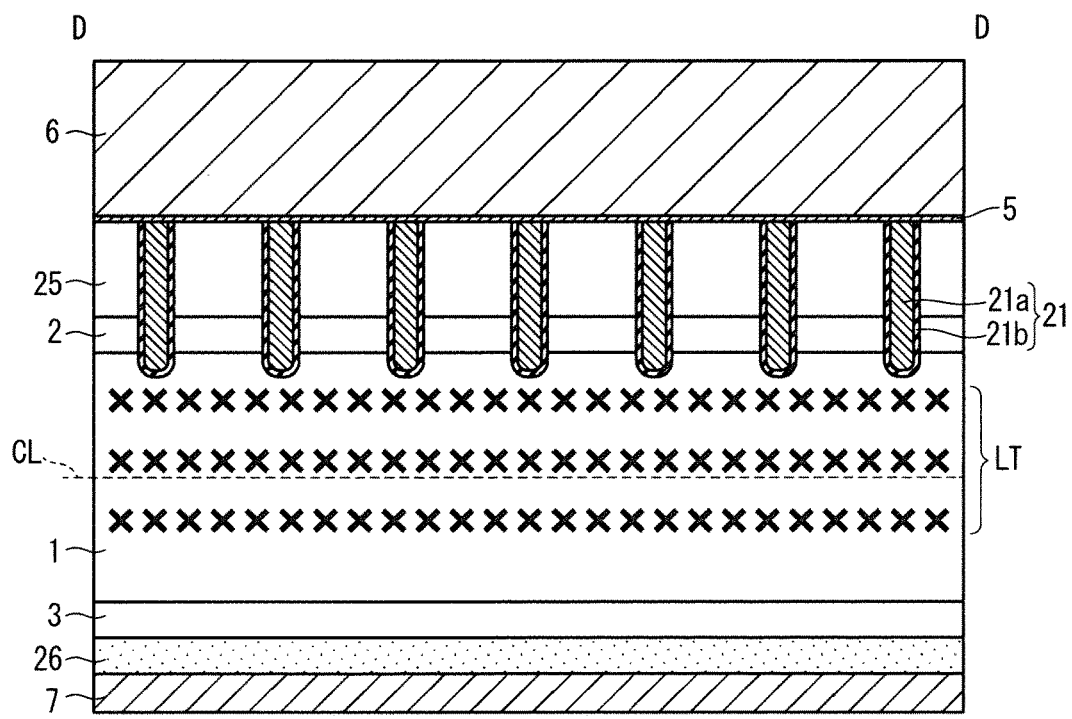
FIG. 13 is a partial cross-sectional view of the RC-IGBT according to the first preferred embodiment.

FIG. 13 is a cross-sectional view taken in a direction of arrows along a line D-D shown in FIG. 11. The cross-sectional configuration of the diode region 20 shown in FIG. 13 differs from that of FIG. 12 in that, as the cross-sectional configuration of FIG. 13 is determined in a direction in which the p-type anode layers 25 are arranged, the $p^+$-type contact layer 24 is absent between the p-type anode layer 25 and the barrier metal 5 and the p-type anode layer 25 forms the first main surface of the semiconductor substrate. Namely, as shown in FIG. 11, the $p^+$-type contact layer 24 is formed selectively on the p-type anode layer 25 to be closer to the first main surface.

<Configuration of Terminal Region>

Figure 14:
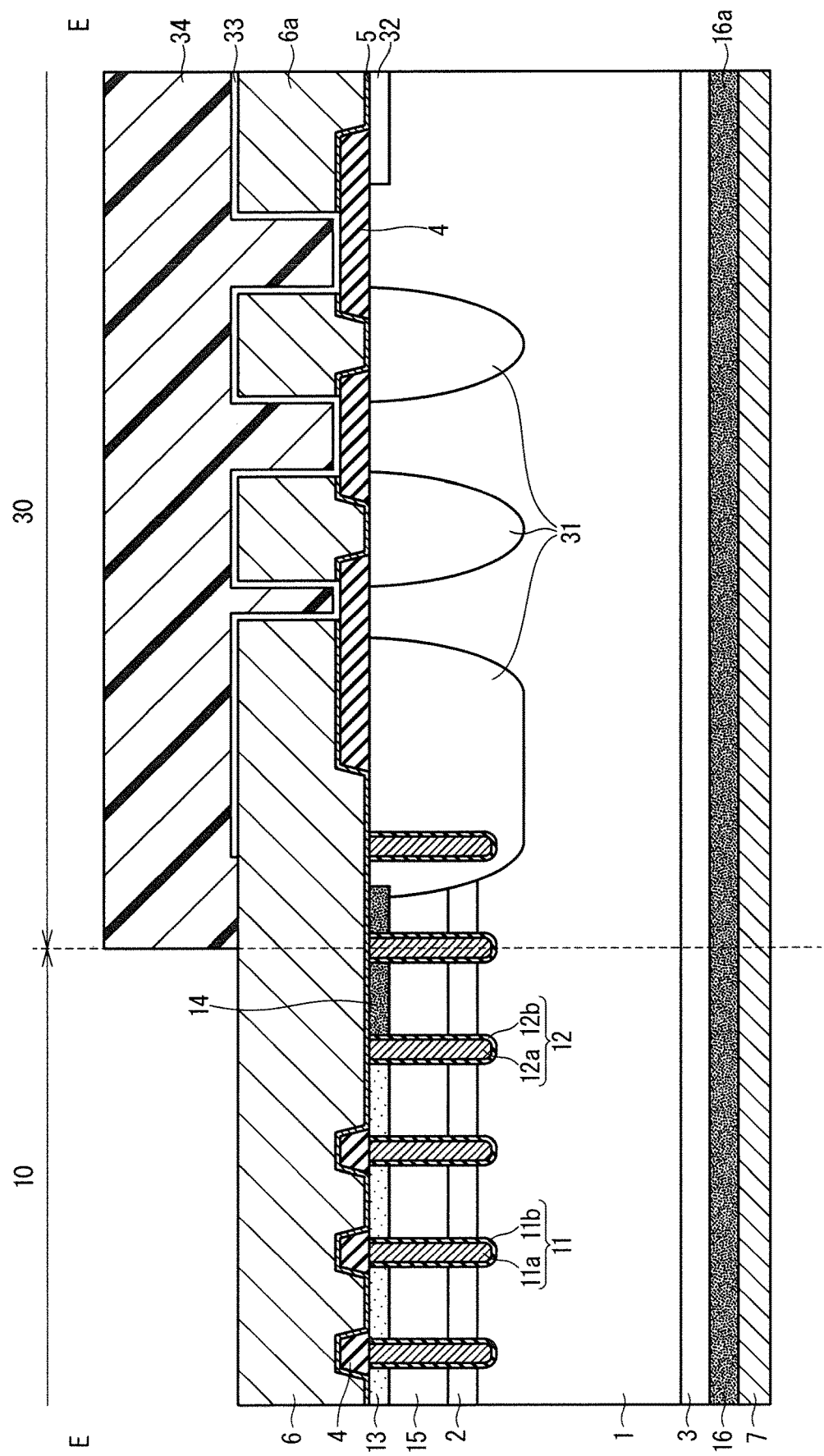
FIG. 14 is a cross-sectional view of a boundary part between the IGBT region and a terminal region in the RC-IGBT according to the first preferred embodiment.

FIG. 14 is a cross-sectional view taken in a direction of arrows along a line E-E indicated in the semiconductor device 100 shown in FIG. 1 or in the semiconductor device 101 shown in FIG. 2. This cross-sectional view shows a configuration at a boundary part between the IGBT region 10 and the terminal region 30.

As shown in FIG. 14, in the terminal region 30 in the semiconductor device 100 or 101, the $n^-$-type drift layer 1 is provided between the first main surface and the second main surface of the semiconductor substrate. The first main surface and the second main surface in the terminal region 30 are on the same plane as the first main surface and on the same plane as the second main surface respectively in each of the IGBT region 10 and the diode region 20. An $n^-$-type drift layer 1 in the terminal region 30 is formed continuously and integrally with the $n^-$-type drift layer 1 in each of the IGBT region 10 and the diode region 20 into the same configuration.

A p-type terminal well layer 31 is provided on the $n^-$-type drift layer 1 to be closer to the first main surface, namely, between the first main surface of the semiconductor substrate and the $n^-$-type drift layer 1. The p-type terminal well layer 31 is a semiconductor layer containing boron (B) or aluminum (Al) as p-type impurity, for example, and having a p-type impurity concentration from $1.0 \times 10^{14}$ to $1.0 \times 10^{19}/cm^3$. The p-type terminal well layer 31 is provided to surround the cell region including the IGBT region 10 and the diode region 20. The p-type terminal well layer 31 is formed into a plurality of ring-like layers. The number of the p-type terminal well layers 31 is selected appropriately depending on breakdown voltage design for the semiconductor device 100 or 101. An $n^+$-type channel stopper layer 32 is provided further externally to the p-type terminal well layer 31. The $n^+$-type channel stopper layer 32 surrounds the p-type terminal well layer 31.

The p-type terminal collector layer 16a is provided between the $n^-$-type drift layer 1 and the second main surface of the semiconductor substrate. The p-type terminal collector layer 16a is formed continuously and integrally with the p-type collector layer 16 in the cell region. For this reason, the p-type collector layer 16 mentioned herein may be a layer including the p-type terminal collector layer 16a.

The collector electrode 7 is formed on the second main surface of the semiconductor substrate. The collector electrode 7 is formed as an integrated electrode extending from the cell region including the IGBT region 10 and the diode region 20 to the terminal region 30 continuously. The emitter electrode 6 extending continuously from the cell region and a terminal electrode 6a separated from the emitter electrode 6 are formed on the first main surface of the semiconductor substrate in the terminal region 30.

The emitter electrode 6 and the terminal electrode 6a are electrically connected to each other through a semi-insulating film 33. The semi-insulating film 33 may be a semi-insulating silicon nitride (sinSiN) film, for example. The terminal electrode 6a, the p-type terminal well layer 31, and the n⁺-type channel stopper layer 32 are electrically connected to each other through a contact hole formed in the interlayer insulating film 4 provided on the first main surface in the terminal region 30. In the terminal region 30, a terminal protective film 34 is provided to cover the emitter electrode 6, the terminal electrode 6a, and the semi-insulating film 33. The terminal protective film 34 may be made of polyimide, for example.

Figure 15:
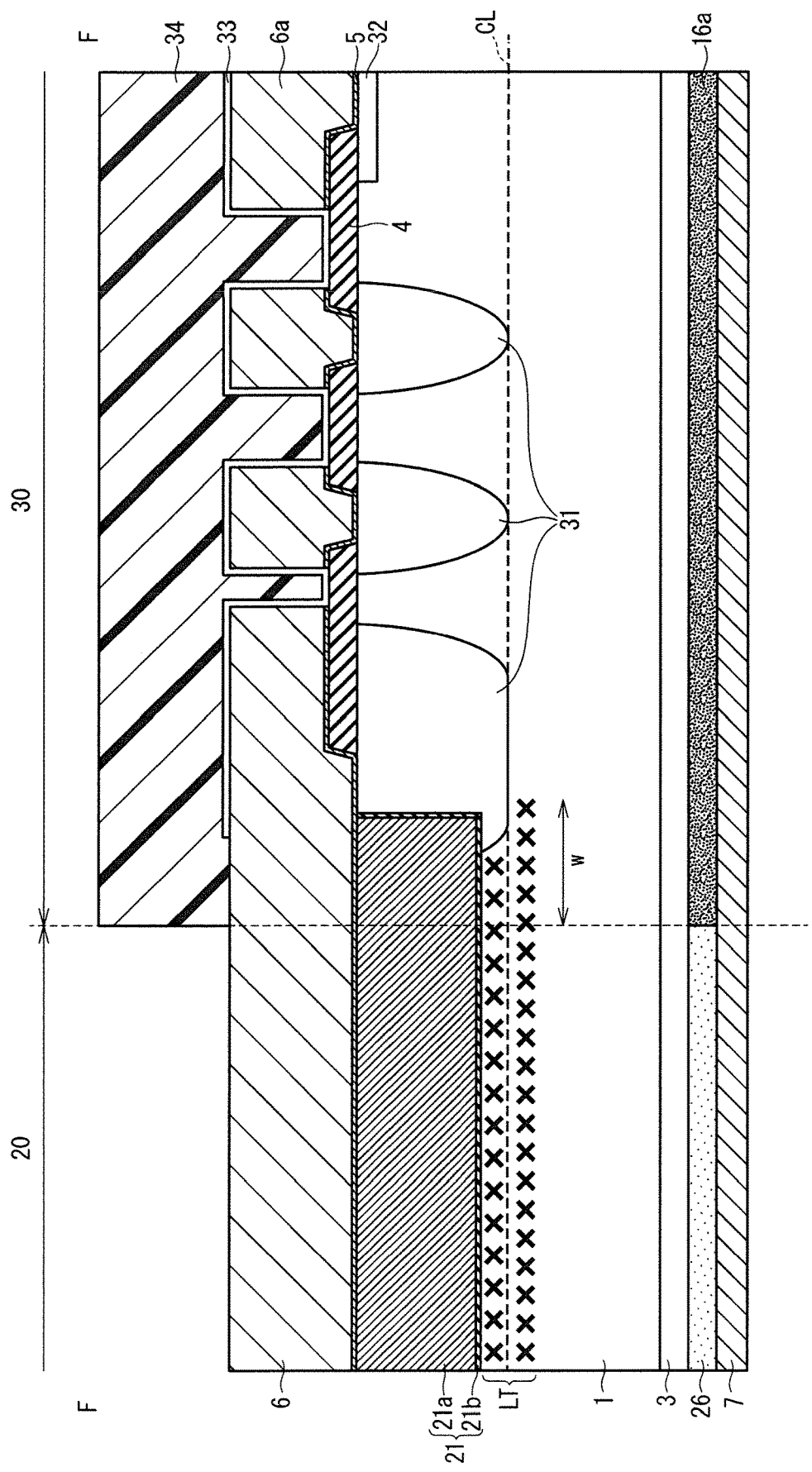
FIG. 15 is a cross-sectional view of a boundary part between the diode region and the terminal region in the RC-IGBT according to the first preferred embodiment.

FIG. 15 is a cross-sectional view taken in a direction of arrows along a line F-F indicated in the semiconductor device 100 shown in FIG. 1. This cross-sectional view shows a configuration at a boundary part between the diode region 20 and the terminal region 30. The cross-sectional view of FIG. 15 is taken in a direction in which the diode trench gate 21 extends, and an end of the diode trench gate 21 in its extending direction goes into the p-type terminal well layer 31.

As shown in FIG. 15, the lifetime control layer LT in the diode region 20 is provided not only in the n⁻-type drift layer 1 in the diode region 20 but is also provided to project into the n⁻-type drift layer 1 in the terminal region 30 across a boundary between the diode region 20 and the terminal region 30. This projecting part of the lifetime control layer LT has a width w, which is the same as the width w of the projecting part of the lifetime control layer LT projecting into the IGBT region 10 across the boundary between the diode region 20 and the IGBT region 10 described above. As shown in FIGS. 3 and 4, like in the case described above, with a thickness from the anode layer end to the intermediate position CL defined as t1 and a thickness from the intermediate position CL to a position of the crystal defect density maximum depth defined as t2, the width w of the projecting part is set so as to fulfill the following: $w > ((3 \times t1) - t2)/2$. Limiting the projecting width w allows reduction in switching loss in the IGBT region 10 while suppressing increase in ON voltage in the IGBT region 10 to be caused by the provision of the lifetime control layer LT. As a result, improvement of recovery breakdown tolerance and improvement of IGBT characteristics are achieved simultaneously.

<Modifications>

Figure 16:
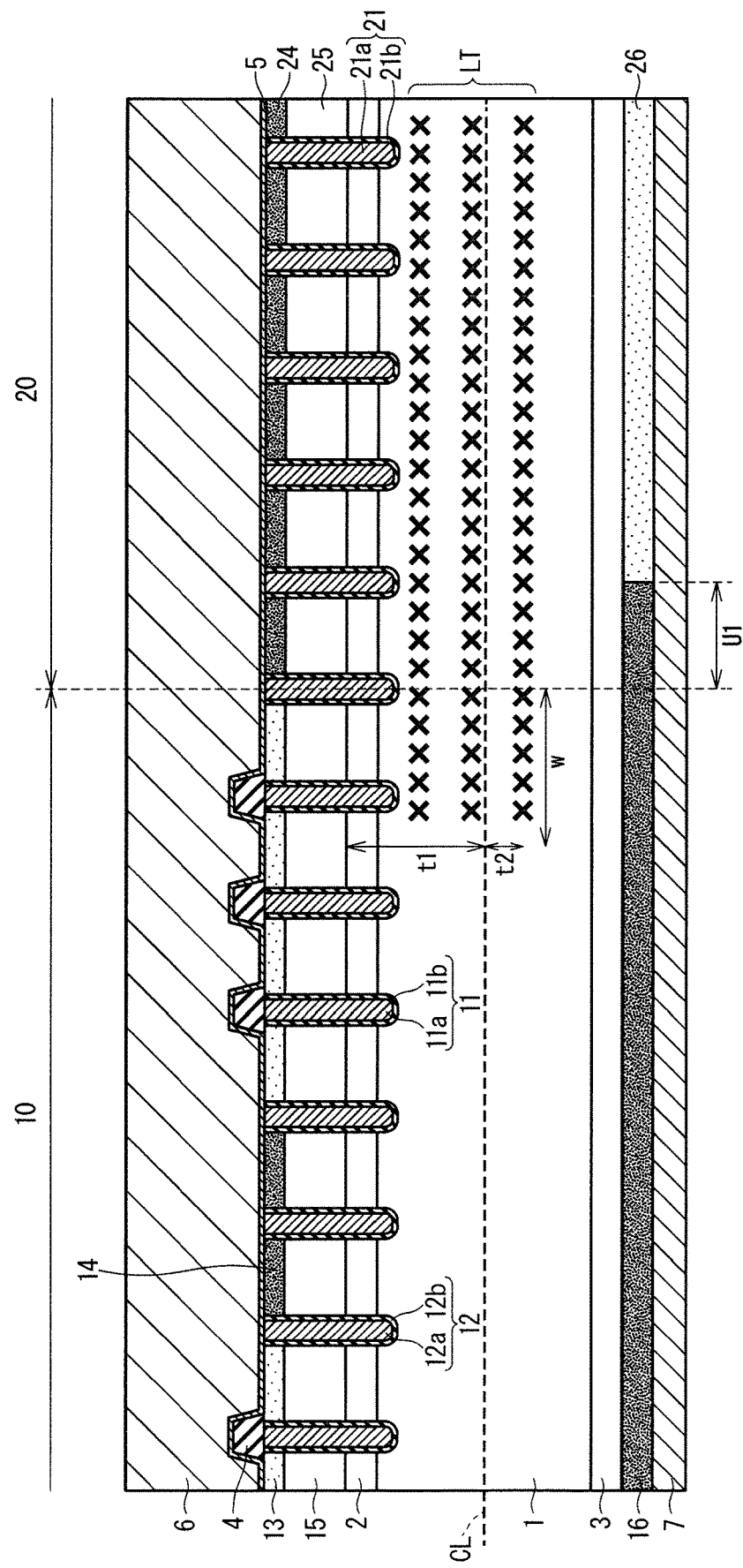
FIG. 16 is a cross-sectional view of a boundary part between an IGBT region and a diode region in an RC-IGBT according to a modification of the first preferred embodiment.

FIG. 16 is a cross-sectional view showing a configuration at a boundary part between the IGBT region 10 and the diode region 20 in a semiconductor device according to a modification of the first preferred embodiment. This cross-sectional view corresponds to the cross-sectional view shown in FIG. 3. The cross-sectional configuration of FIG. 16 differs from the cross-sectional configuration of FIG. 3 in that the p-type collector layer 16 provided on the second main surface in the IGBT region 10 protrudes from a boundary between the IGBT region 10 and the diode region 20 into the diode region 20 by a distance U1. Making the p-type collector layer 16 protrude into the diode region 20 in this way makes it possible to increase a distance between the n⁺-type cathode layer 26 in the diode region 20 and the active trench gate 11. Thus, even when a gate driving voltage is applied to the active trench gate 11 during the operation of a free wheeling diode, it still becomes possible to suppress flow of a current from a channel formed adjacent to the active trench gate 11 in the IGBT region 10 into the n⁺-type cathode layer 26. The distance U1 may be 100 µm, for example. The distance U1 may be set at zero or a distance less than 100 µm depending on the purpose of use of the semiconductor device 100 or 101.

The foregoing region in which the p-type collector layer 16 protrudes from the boundary between the IGBT region 10 and the diode region 20 into the diode region 20 by the distance U1 will be called a boundary region. The boundary region may be provided not only at the boundary part between the IGBT region 10 and the diode region 20 but also at the boundary part between the diode region 20 and the terminal region 30.

In the presence of the boundary region, if the distance U1 of the boundary region is less than the width w of the projecting part of the lifetime control layer LT, the lifetime control layer LT is provided to extend from the diode region 20 to the IGBT region 10 across the boundary region, as shown in FIG. 16. If the distance U1 of the boundary region is greater than the width w of the projecting part of the lifetime control layer LT, the lifetime control layer LT is provided to extend from the diode region 20 to the boundary region.

Figure 17:
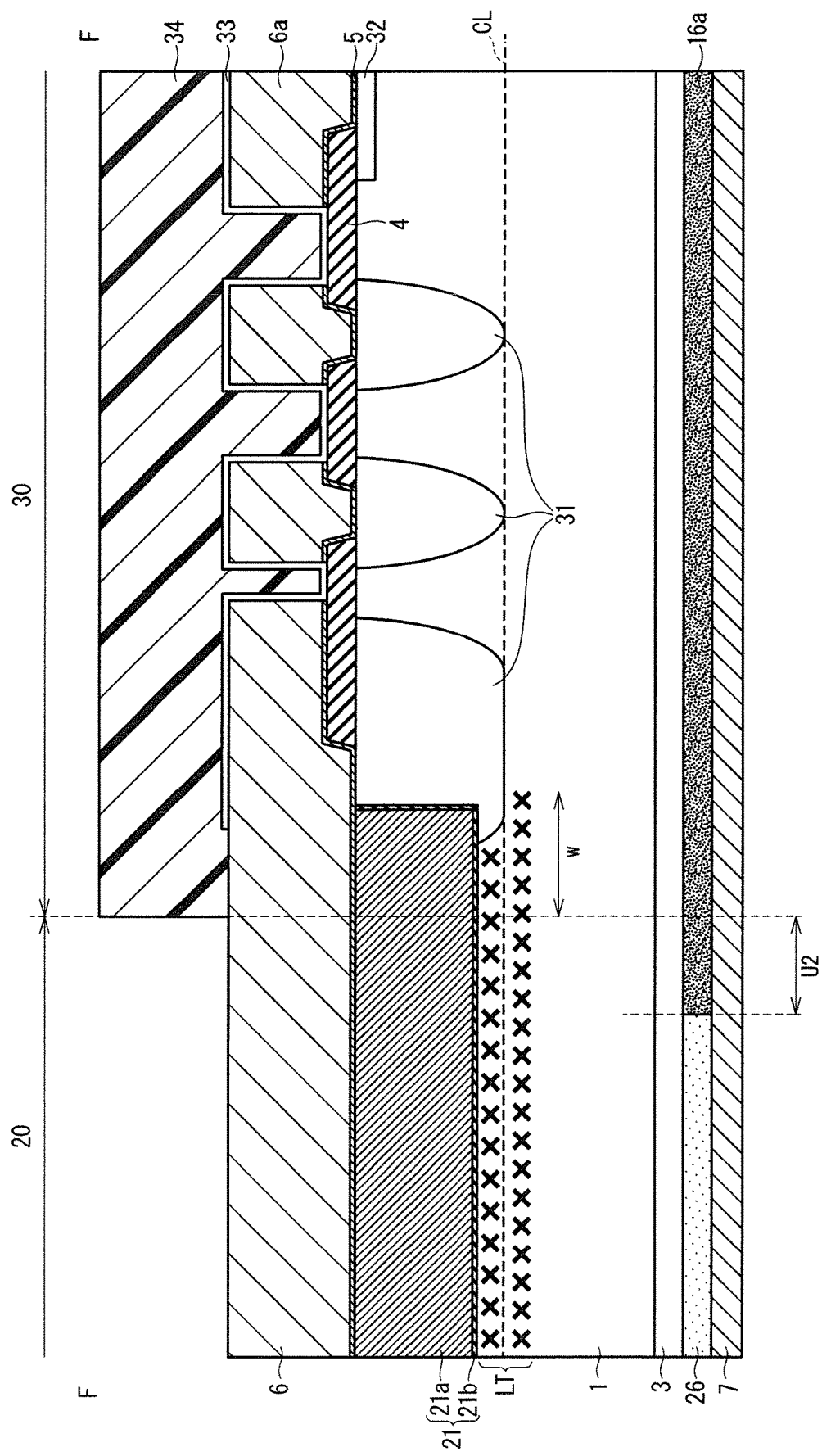
FIG. 17 is a cross-sectional view of a boundary part between a diode region and a terminal region in an RC-IGBT according to a modification of the first preferred embodiment.

FIG. 17 is a cross-sectional view showing a configuration at a boundary part between the diode region 20 and the terminal region 30 in a semiconductor device according to a modification of the first preferred embodiment. This cross-sectional view corresponds to the cross-sectional view shown in FIG. 15. As shown in FIG. 17, the p-type terminal collector layer 16a is provided in such a manner that an end of the p-type terminal collector layer 16a closer to the diode region 20 protrudes into the diode region 20 by a distance U2. Making the p-type terminal collector layer 16a protrude into the diode region 20 in this way makes it possible to increase a distance between the n⁺-type cathode layer 26 in the diode region 20 and the p-type terminal well layer 31. This reduces a likelihood that the p-type terminal well layer 31 will operate as an anode of a diode. The distance U2 may be 100 µm, for example.

In the presence of the boundary region, if the distance U2 of the boundary region is less than the width w of the projecting part of the lifetime control layer LT, the lifetime control layer LT is provided to extend from the diode region 20 to the terminal region 30 across the boundary region, as shown in FIG. 17. If the distance U2 of the boundary region is greater than the width w of the projecting part of the lifetime control layer LT, the lifetime control layer LT is provided to extend from the diode region 20 to the boundary region.

<Method of Manufacturing RC-IGBT>

A method of manufacturing the semiconductor device 100 or 101 as an RC-IGBT will be described next by referring to FIGS. 18 to 28 showing manufacturing steps sequentially.

Figure 18:
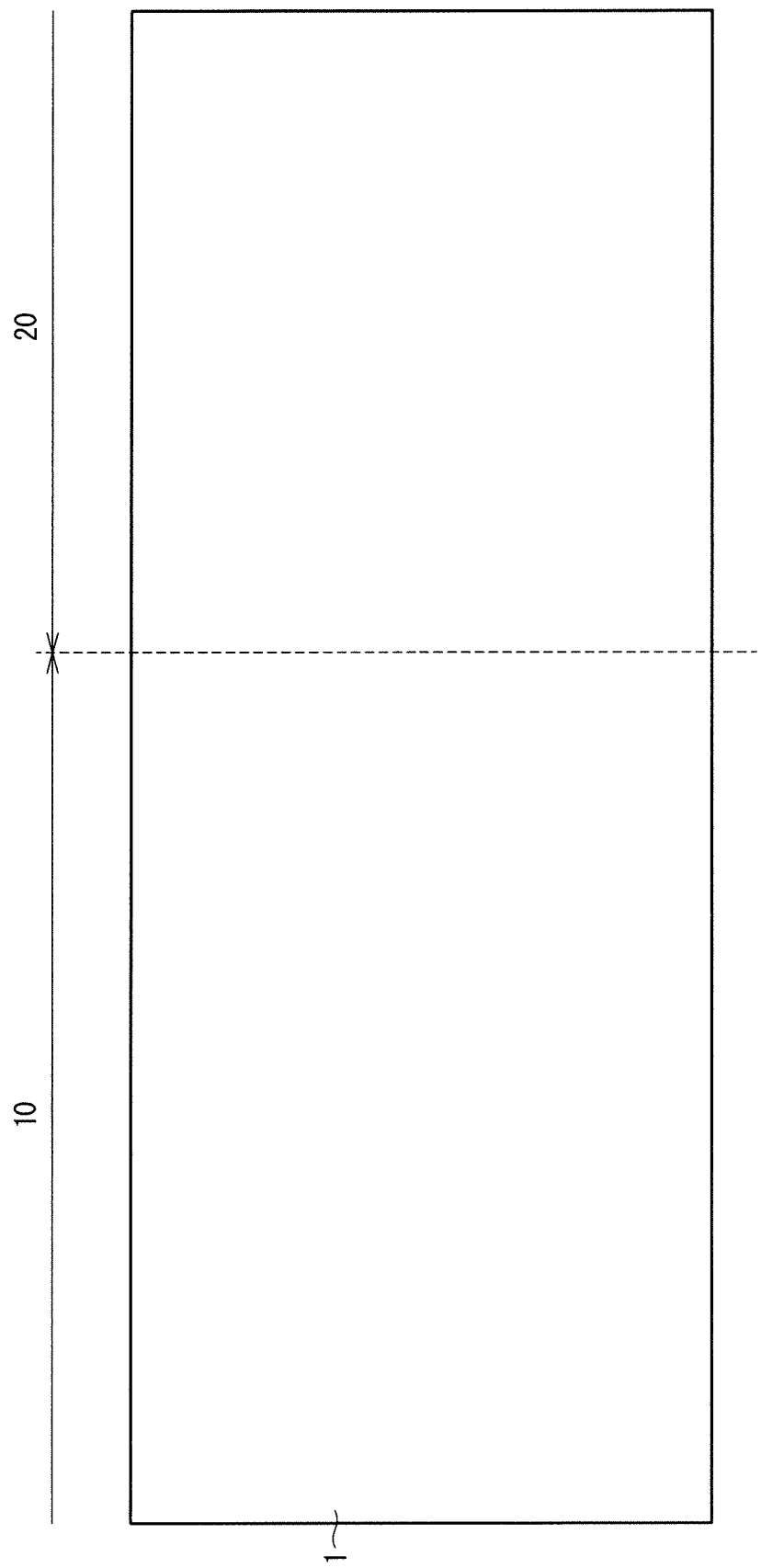
FIGS. 18 to 28 are cross-sectional views each describing a method of manufacturing the RC-IGBT according to the first preferred embodiment.

First, as shown in FIG. 18, a semiconductor substrate to form the n⁻-type drift layer 1 is prepared. A substrate to be used as the semiconductor substrate may be an n-type wafer containing n-type impurity that may be what is called an FZ wafer formed by the floating zone (FZ) method or may be what is called an MCZ wafer formed by the magnetic-field applied Czochralski (MCZ) method, for example. The concentration of the n-type impurity in the semiconductor substrate is selected appropriately depending on the breakdown voltage of the semiconductor device to be formed. If the semiconductor device is to be formed to have a breakdown voltage of 1200 V, for example, the concentration of the n-type impurity is adjusted in such a manner that the n⁻-type drift layer 1 to form the semiconductor substrate is given a specific resistance in a range from about 40 to about 120 Ω·cm. As shown in FIG. 18, in a step of preparing the semiconductor substrate, the semiconductor substrate is entirely formed of the n-type drift layer 1. By implanting p-type or n-type impurity ions from the side of the first main surface or the second main surface of the semiconductor substrate and then performing thermal process to diffuse the implanted ions in the semiconductor substrate, a p-type or n-type semiconductor layer is formed to manufacture the semiconductor device 100 or 101.

As shown in FIG. 18, the semiconductor substrate forming the n$^-$-type drift layer 1 includes a region to become the IGBT region 10 and a region to become the diode region 20. While not shown in FIG. 18, a region to become the terminal region 30 is provided around the regions to become the IGBT region 10 and the diode region 20. While the following description is intended mainly for a method of manufacturing the configurations of the IGBT region 10 and the diode region 20 in the semiconductor device 100 or 101, the terminal region 30 in the semiconductor device 100 or 101 may be manufactured by a well-known method. If an FLR with the p-type terminal well layer 31 is to be formed as a breakdown voltage retaining structure in the terminal region 30, for example, this FLR may be formed by implanting p-type impurity ions before the IGBT region 10 and the diode region 20 in the semiconductor device 100 or 101 are processed. Alternatively, this FLR may be formed by implanting p-type impurity ions simultaneously with ion implantation of p-type impurity into the IGBT region 10 or the diode region 20 in the semiconductor device 100.

Figure 19:
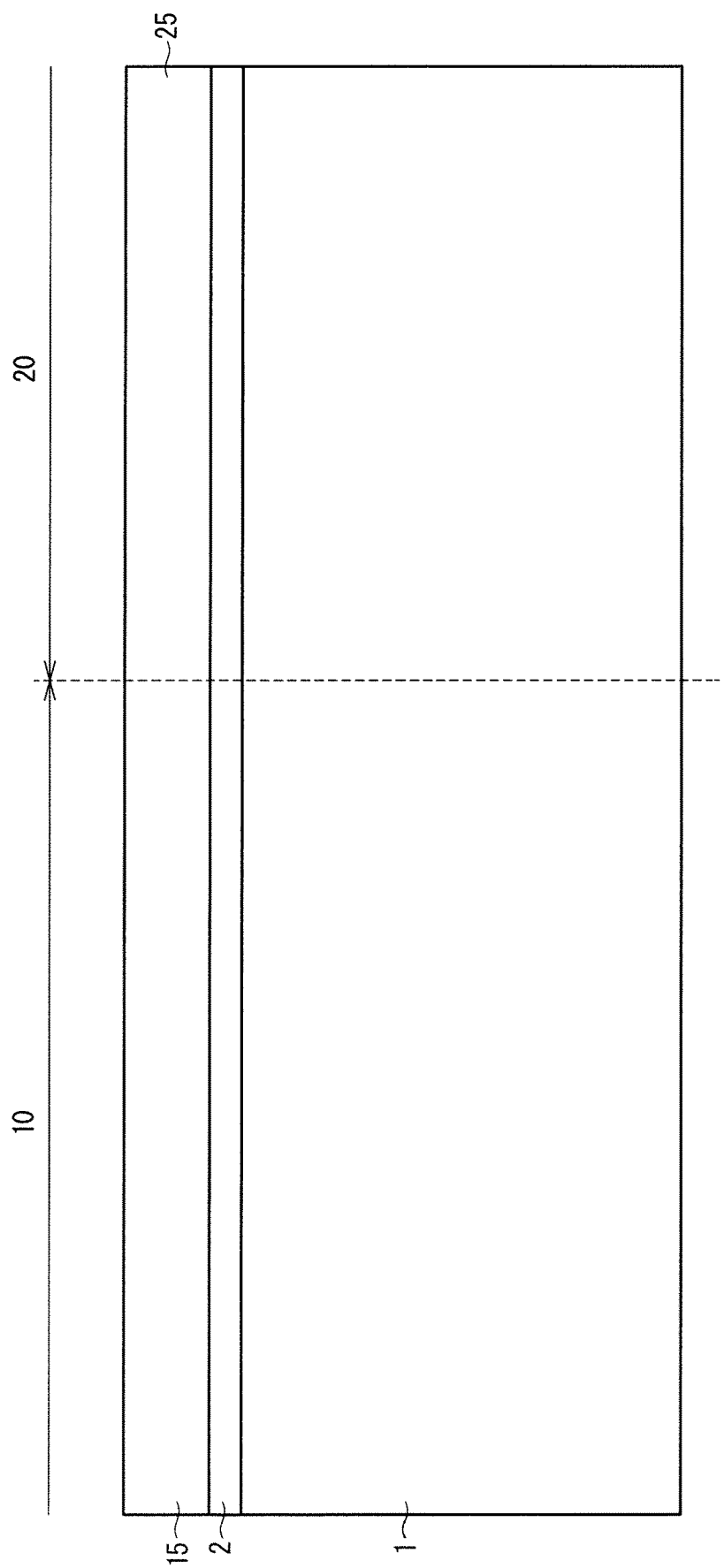

Next, as shown in FIG. 19, n-type impurity such as phosphorus (P) is implanted from the side of the first main surface of the semiconductor substrate to form the n-type carrier stored layer 2. Further, p-type impurity such as boron (B) is implanted from the side of the first main surface of the semiconductor substrate to form the p-type base layer 15 and the p-type anode layer 25. The n-type carrier stored layer 2, the p-type base layer 15, and the p-type anode layer 25 are formed by diffusing the impurity ions by thermal process after implanting the impurity ions into the semiconductor substrate. The n-type impurity and the p-type impurity are ion-implanted after implementation of mask process on the first main surface of the semiconductor substrate, so that the n-type carrier stored layer 2, the p-type base layer 15, and the p-type anode layer 25 are formed selectively on the first main surface of the semiconductor substrate. The n-type carrier stored layer 2, the p-type base layer 15, and the p-type anode layer 25 are formed in the IGBT region 10 and the diode region 20, and are connected to the p-type terminal well layer 31 in the terminal region 30.

The mask process means process of applying a resist onto the semiconductor substrate and forming an opening in a predetermined region of the resist by photolithography, thereby forming a mask on the semiconductor substrate to be used for implanting ions into the predetermined region of the semiconductor substrate or performing etching.

The p-type base layer 15 and the p-type anode layer 25 may be formed by ion-implanting the p-type impurity into these layers simultaneously. In this case, the p-type base layer 15 and the p-type anode layer 25 are formed into the same configuration with the same depth and the same p-type impurity concentration. Alternatively, the p-type impurity may be ion-implanted into the p-type base layer 15 and the p-type anode layer 25 separately after implementation of the mask process, thereby forming the p-type base layer 15 and the p-type anode layer 25 into different depths and different p-type impurity concentrations.

The p-type terminal well layer 31 to be formed at a different cross section may be provided by ion-implanting the p-type impurity simultaneously with formation of the p-type anode layer 25. In this case, the p-type terminal well layer 31 and the p-type anode layer 25 can be formed into the same configuration with the same depth and the same p-type impurity concentration. In another case, the p-type terminal well layer 31 and the p-type anode layer 25 may be formed by ion-implanting the p-type impurity simultaneously into these layers in such a manner as to provide different p-type impurity concentrations in the p-type terminal well layer 31 and the p-type anode layer 25. This can be realized by changing an opening ratio using a mesh-like mask for one or both of these layers.

The p-type impurity may be ion-implanted into the p-type terminal well layer 31 and the p-type anode layer 25 separately after implementation of the mask process, thereby forming the p-type terminal well layer 31 and the p-type anode layer 25 into different depths and different p-type impurity concentrations. The p-type terminal well layer 31, the p-type base layer 15, and the p-type anode layer 25 may be formed by ion-implanting the p-type impurity simultaneously.

Figure 20:
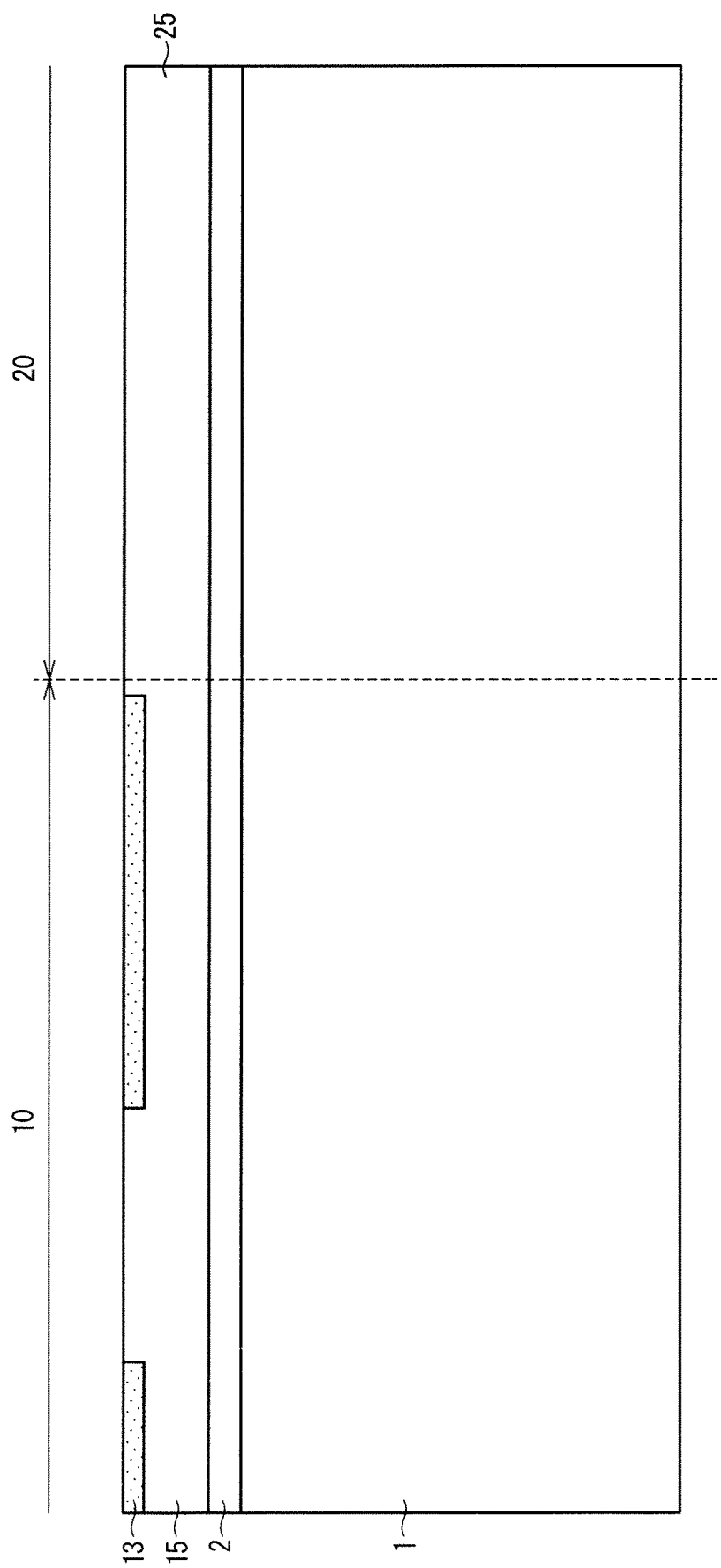

Next, as shown in FIG. 20, n-type impurity is implanted selectively into the p-type base layer 15 on the side of the first main surface in the IGBT region 10 after implementation of the mask process to form the n$^+$-type source layer 13. The implanted n-type impurity may be arsenic (As) or phosphorus (P), for example.

Figure 21:
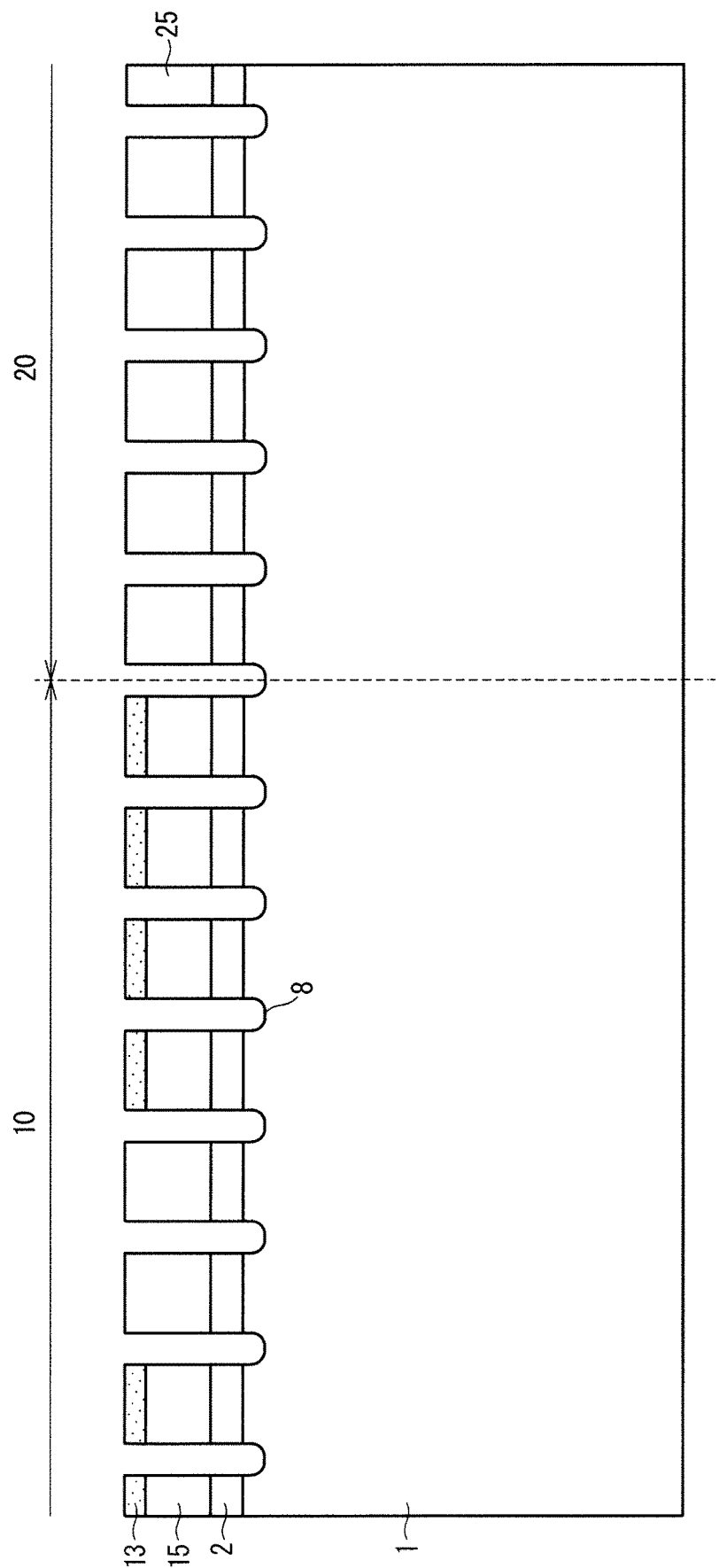

Next, as shown in FIG. 21, trenches 8 are formed from the first main surface of the semiconductor substrate to reach the n$^-$-type drift layer 1 while penetrating the p-type base layer 15 and the p-type anode layer 25. In the IGBT region 10, the trench 8 penetrating the n$^+$-type source layer 13 has a side wall forming a part of the n$^+$-type source layer 13. The trench 8 may be formed by depositing an oxide film such as an SiO$_2$ film on the semiconductor substrate, then forming an opening in the oxide film by the mask process at a position where the trench 8 is to be formed, and etching the semiconductor substrate using the oxide film with the opening as a mask. In FIG. 21, the pitch of the trenches 8 formed in the IGBT region 10 and that of the trenches 8 formed in the diode region 20 are equal to each other. However, the pitch of the trenches 8 may differ between the IGBT region 10 and the diode region 20. A pattern of the pitch of the trenches 8 in a plan view can be changed appropriately by changing a mask pattern for the mask process.

Figure 22:
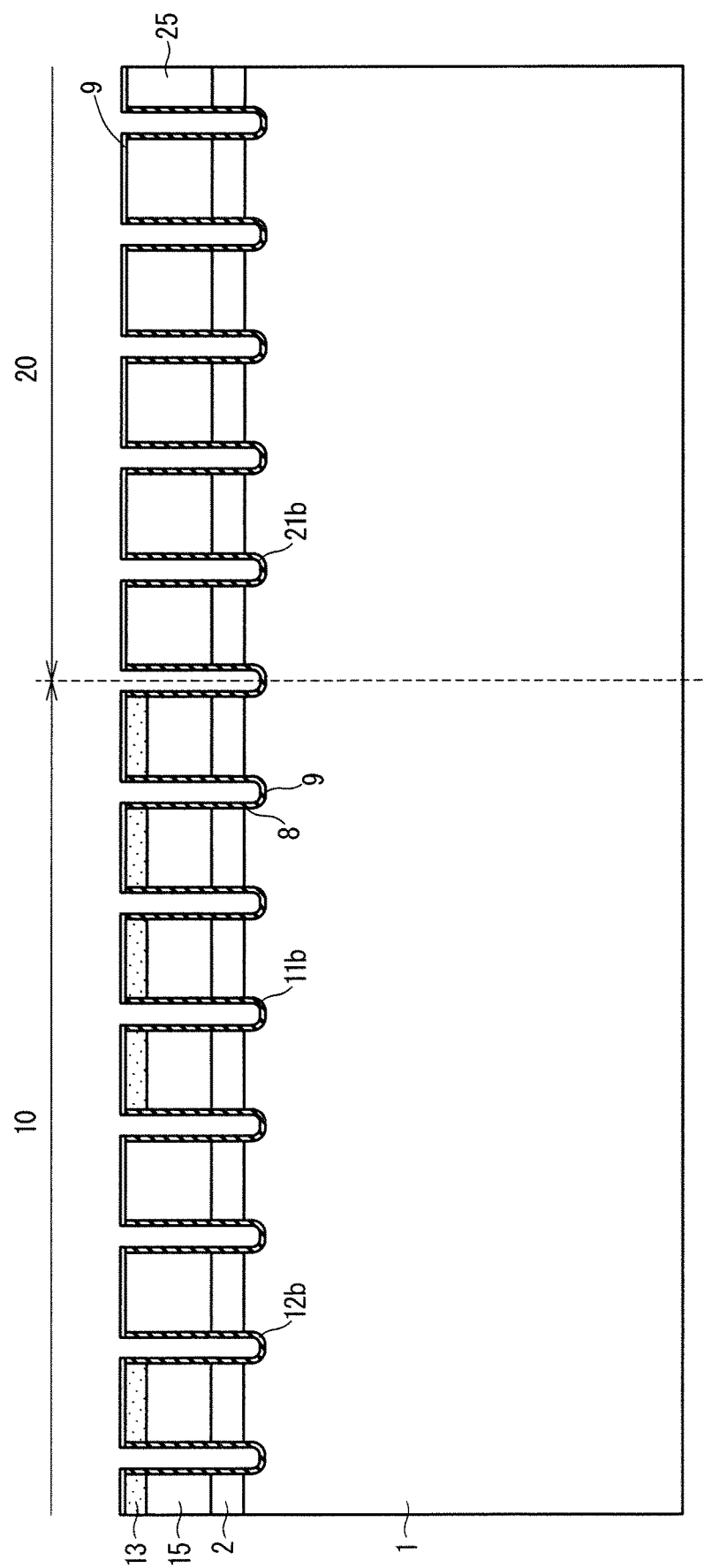

Next, as shown in FIG. 22, the semiconductor substrate is heated in an atmosphere containing oxygen to form an oxide film 9 on the inner wall of the trench 98 and on the first main surface of the semiconductor substrate. Of the oxide film 9 formed on the inner wall of the trenches 8, the oxide film 9 formed in the trenches 8 in the IGBT region 10 becomes the gate trench insulating film 11b of the active trench gate 11 and the dummy trench insulating film 12b of the dummy trench gate 12. The oxide film 9 formed in the trench 8 in the diode region 20 becomes the diode trench insulating film 21b. The oxide film 9 formed on the first main surface of the semiconductor substrate is removed in a step performed later.

Figure 23:
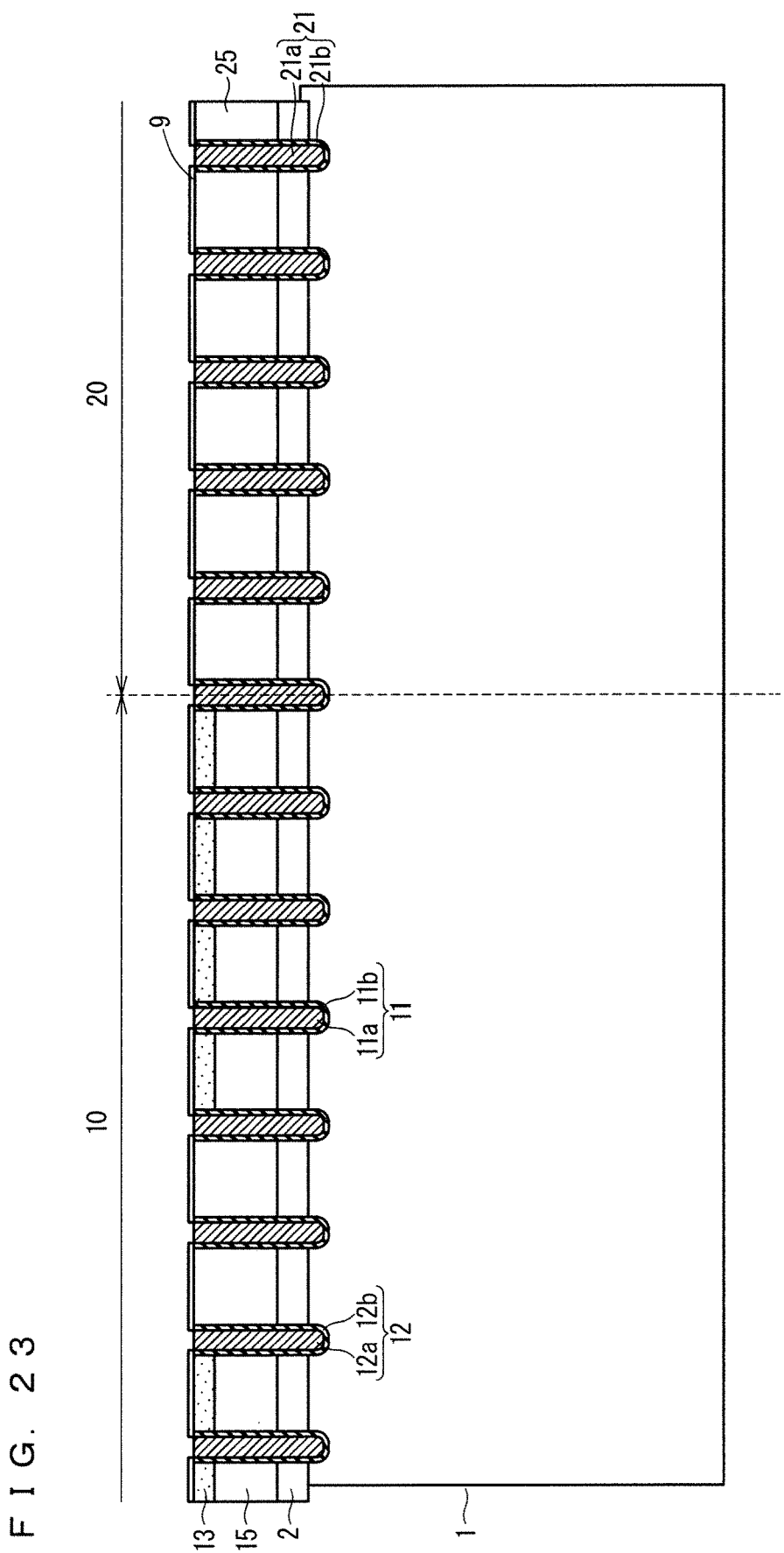

Next, as shown in FIG. 23, polysilicon doped with n-type or p-type impurity is deposited by chemical vapor deposition (CVD), for example, in the trenches 8 in which the oxide film 9 is formed on the inner walls thereof, thereby forming the gate trench electrode 11a, the dummy trench electrode 12a, and the diode trench electrode 21a.

Figure 24:
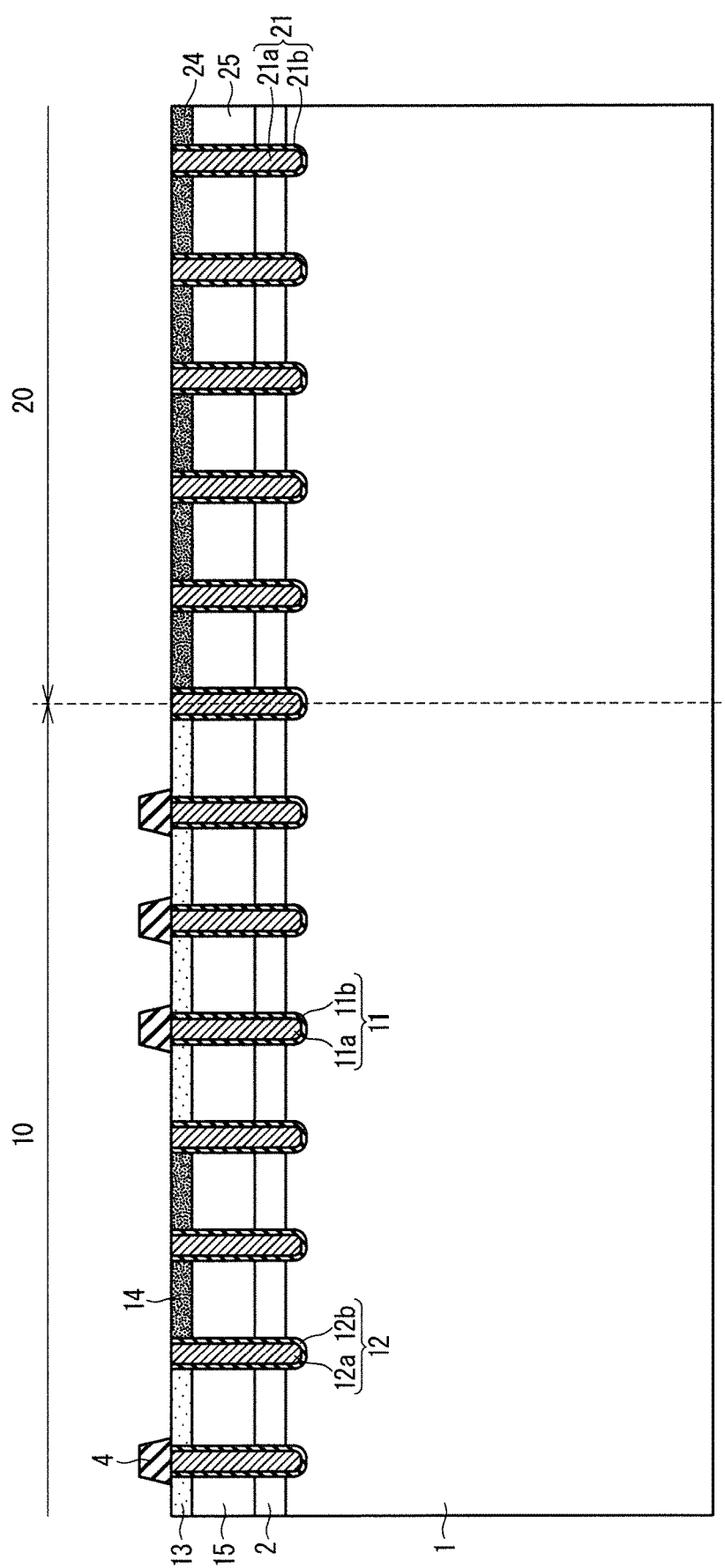

Next, as shown in FIG. 24, the interlayer insulating film 4 is formed on the gate trench electrode 11a of the active trench gate 11 in the IGBT region 1. Then, the oxide film 9 existing on the first main surface of the semiconductor substrate is removed. The interlayer insulating film 4 may be an $SiO_2$ film, for example. Then, the mask process is performed to form contact holes in the deposited interlayer insulating film 4. The contact holes are formed on the $n^+$-type source layer 13, on the $p^+$-type contact layer 14, on the $p^+$-type contact layer 24, on the dummy trench electrode 12a, and on the diode trench electrode 21a.

Figure 25:
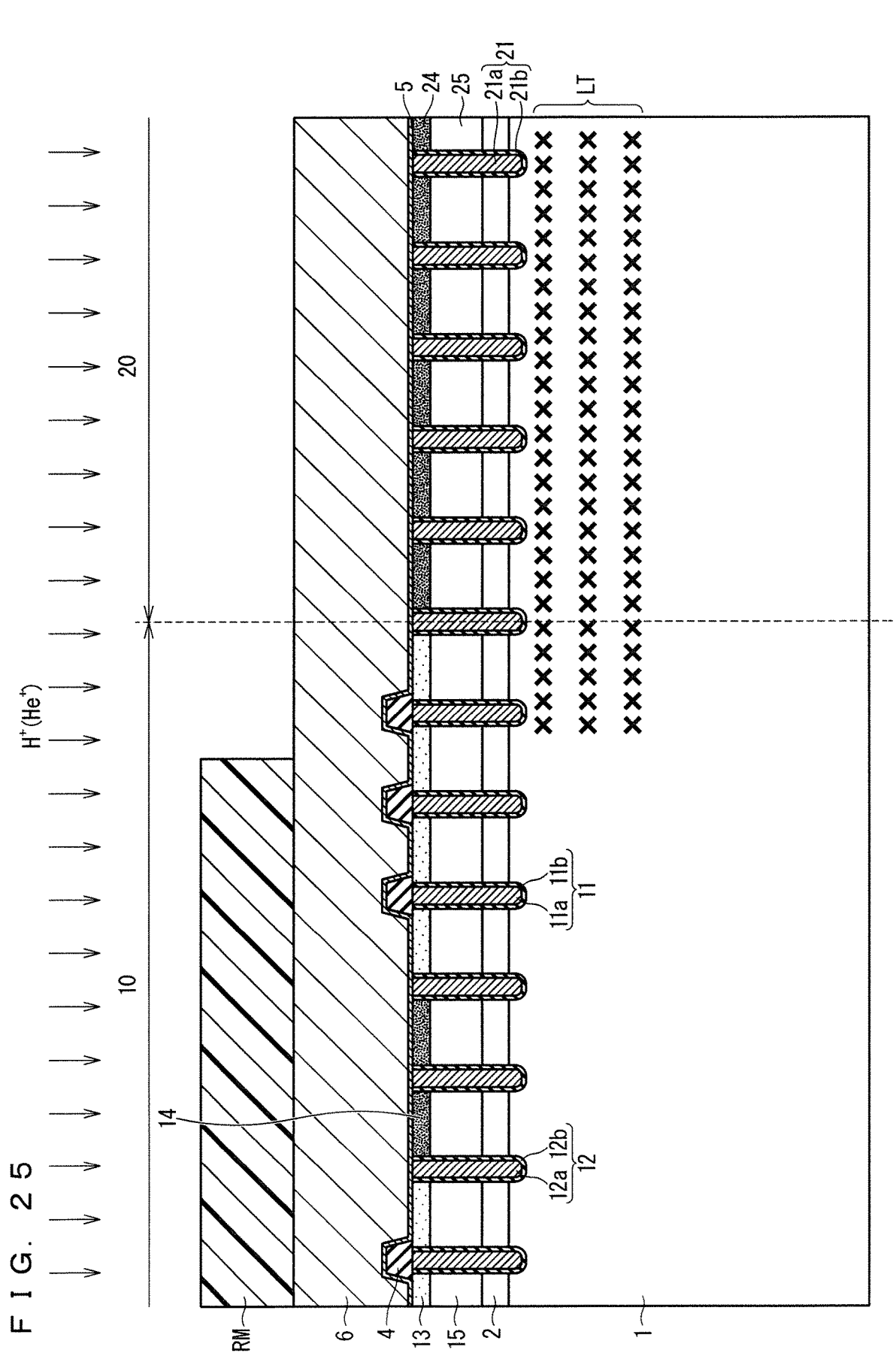

Next, as shown in FIG. 25, the barrier metal 5 is formed on the first main surface of the semiconductor substrate and on the interlayer insulating film 4. Further, the emitter electrode 6 is formed on the barrier metal 5. The barrier metal 5 is formed by depositing titanium nitride by physical vapor deposition (PDV) or CVD.

The emitter electrode 6 may be formed by depositing an aluminum silicon alloy (Al—Si based alloy) on the barrier metal 5 by PVD such as sputtering or evaporation, for example. The emitter electrode 6 may further contain a nickel alloy (Ni alloy) formed by electroless plating or electrolytic plating on the resultant aluminum silicon alloy. Using plating for forming the emitter electrode 6 makes it possible to form a thick metallic film easily as the emitter electrode 6. This increases the heat capacity of the emitter electrode 6 to allow improvement of heat resistance. If the nickel alloy is to be formed further by plating process after formation of the emitter electrode 6 using the aluminum silicon alloy by PVD, the plating process for forming the nickel alloy may be performed after implementation of process on the semiconductor substrate on the side of the second main surface.

Next, as shown in FIG. 25, a resist mask RM is formed. The resist mask RM has an opening part corresponding to an upper part of the IGBT region 10 in the boundary part between the IGBT region 10 and the diode region 20 and corresponding to an upper part of the diode region 20. Then, light ions such as helium or hydrogen ions (protons) are ion-implanted from above the resist mask RM, thereby forming the lifetime control layer LT in the $n^-$-type drift layer 1 under the opening part. The light ions are implanted at an implantation dose from $1.0 \times 10^{10}$ to $1.0 \times 10^{12}$ ions/cm$^2$ in terms of surface density, for example, and at implantation energy from several megaelectronvolts to several tens of megaelectronvolts. After the ion implantation, annealing (thermal process) for partially recovering defect is performed at a temperature from 200 to 450° C., for example. Timing of the annealing can be determined freely as long as the annealing is performed after implantation of the light ions. The resist mask RM may be replaced with a metal mask.

Figure 26:
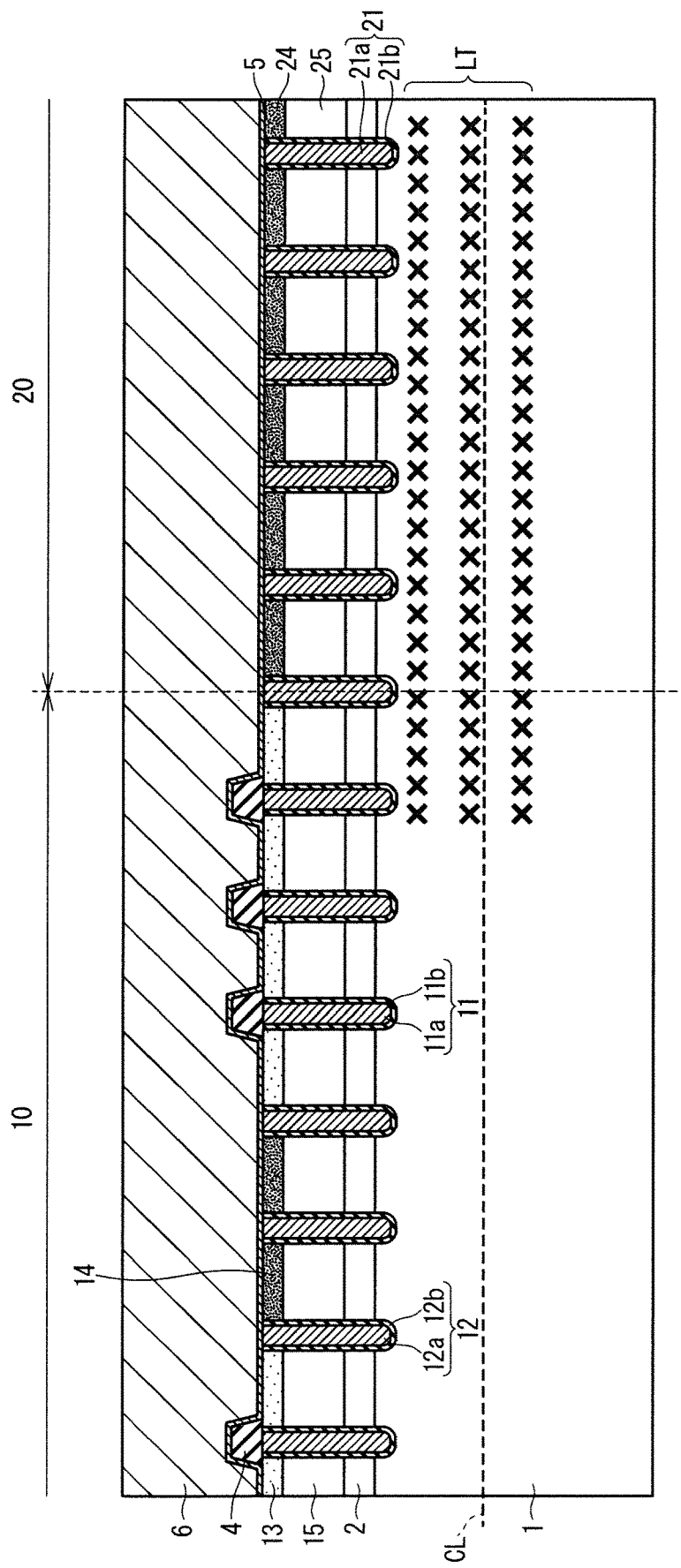

Next, as shown in FIG. 26, the semiconductor substrate is polished on the side of the second main surface to thin the semiconductor substrate to a predetermined designed thickness. The thickness of the semiconductor substrate after the polishing may be from 30 to 600 μm, for example. This thinning is performed in such a manner that the lifetime control layer LT after the thinning has a depth at a deeper position than the intermediate position CL of the $n^-$-type drift layer 1 shown in FIG. 3, for example.

Figure 27:
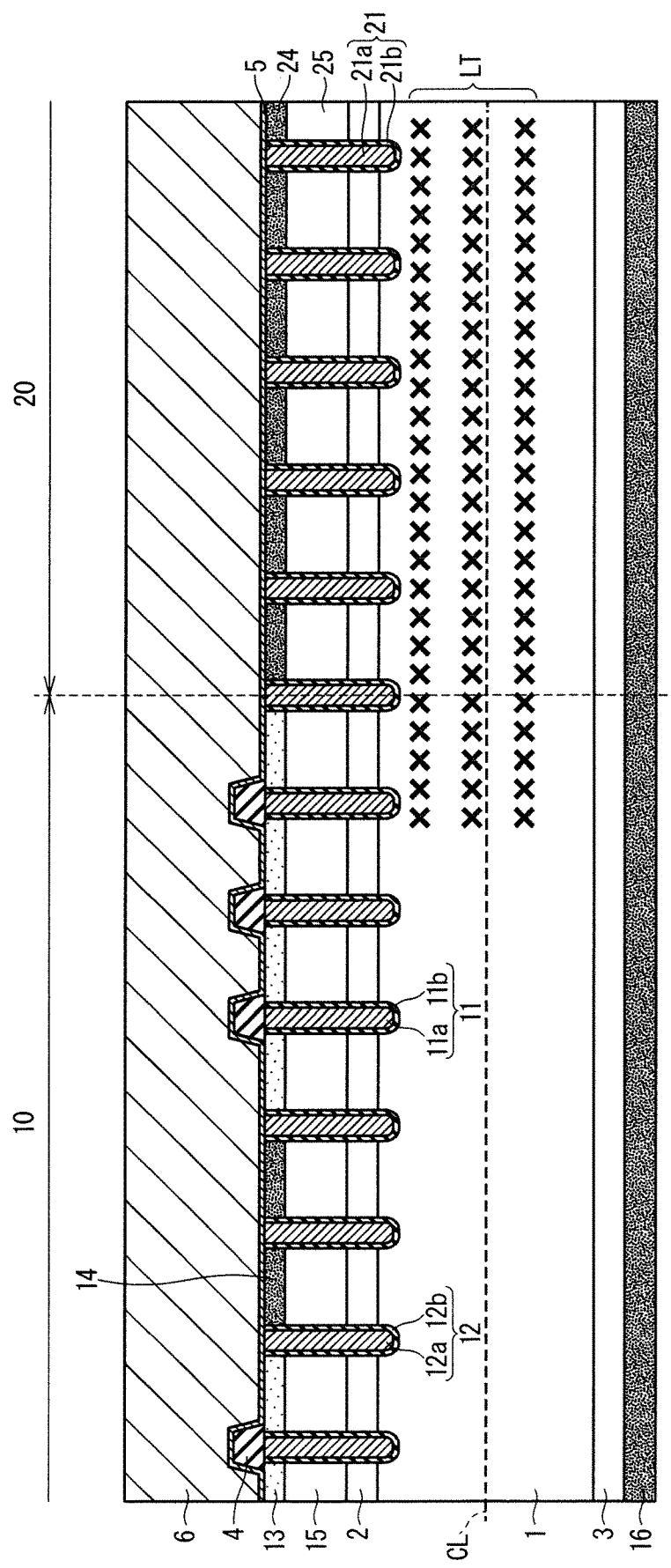

Next, as shown in FIG. 27, n-type impurity is implanted from the side of the second main surface of the semiconductor substrate to form the n-type buffer layer 3. Then, p-type impurity is implanted from the side of the second main surface of the semiconductor substrate to form the p-type collector layer 16. The n-type buffer layer 3 may be formed in the IGBT region 10, the diode region 20, and the terminal region 30, or may be formed only in the IGBT region 10 or the diode region 20.

The n-type buffer layer 3 may be formed by implanting phosphorus (P) ions, for example. Alternatively, the n-type buffer layer 3 may be formed by implanting protons ($H^+$). In another case, the n-type buffer layer 3 may be formed by implanting both protons and phosphorus. Protons can be implanted into a deep position from the second main surface of the semiconductor substrate at relatively low acceleration energy. Changing the acceleration energy makes it possible to change the depth of implantation of protons relatively easily. For this reason, implanting protons several times while changing acceleration energy during formation of the n-type buffer layer 3 using protons allows the resultant n-type buffer layer 3 to have a greater width in the thickness direction of the semiconductor substrate than the n-type buffer layer 3 made of phosphorus.

Phosphorus as n-type achieves a higher activation rate than protons. Thus, even in the semiconductor substrate thinned by using phosphorus for forming the n-type buffer layer 3, punch-through of a depletion layer is still suppressed more reliably. For thinning the semiconductor substrate further, both protons and phosphorus are implanted preferably to form the n-type buffer layer 3. In this case, protons are implanted to a deeper position from the second main surface than phosphorus.

The p-type collector layer 16 may be formed by implanting boron (B), for example. The p-type collector layer 16 is further formed in the terminal region 30 and the p-type collector layer 16 in the terminal region 30 becomes the p-type terminal collector layer 16a. After the ion implantation from the side of the second main surface of the semiconductor substrate, the second main surface is subjected to laser annealing by being irradiated with laser to activate the implanted boron, thereby forming the p-type collector layer 16. At this time, phosphorus implanted to a relatively shallow position from the second main surface of the semiconductor substrate for forming the n-type buffer layer 3 is also activated simultaneously. By contrast, protons are activated at a relatively low annealing temperature in a range from 380 to 420° C. For this reason, after implantation of the protons, consideration is required to be given so as not to place the semiconductor substrate entirely in a temperature higher than the range from 380 to 420° C. in steps other than a step for activating the protons. The laser annealing allows the semiconductor substrate to be placed in a high temperature only in the vicinity of the second main surface, so that it is available for activating the n-type impurity or p-type impurity even after implantation of the protons.

Figure 28:
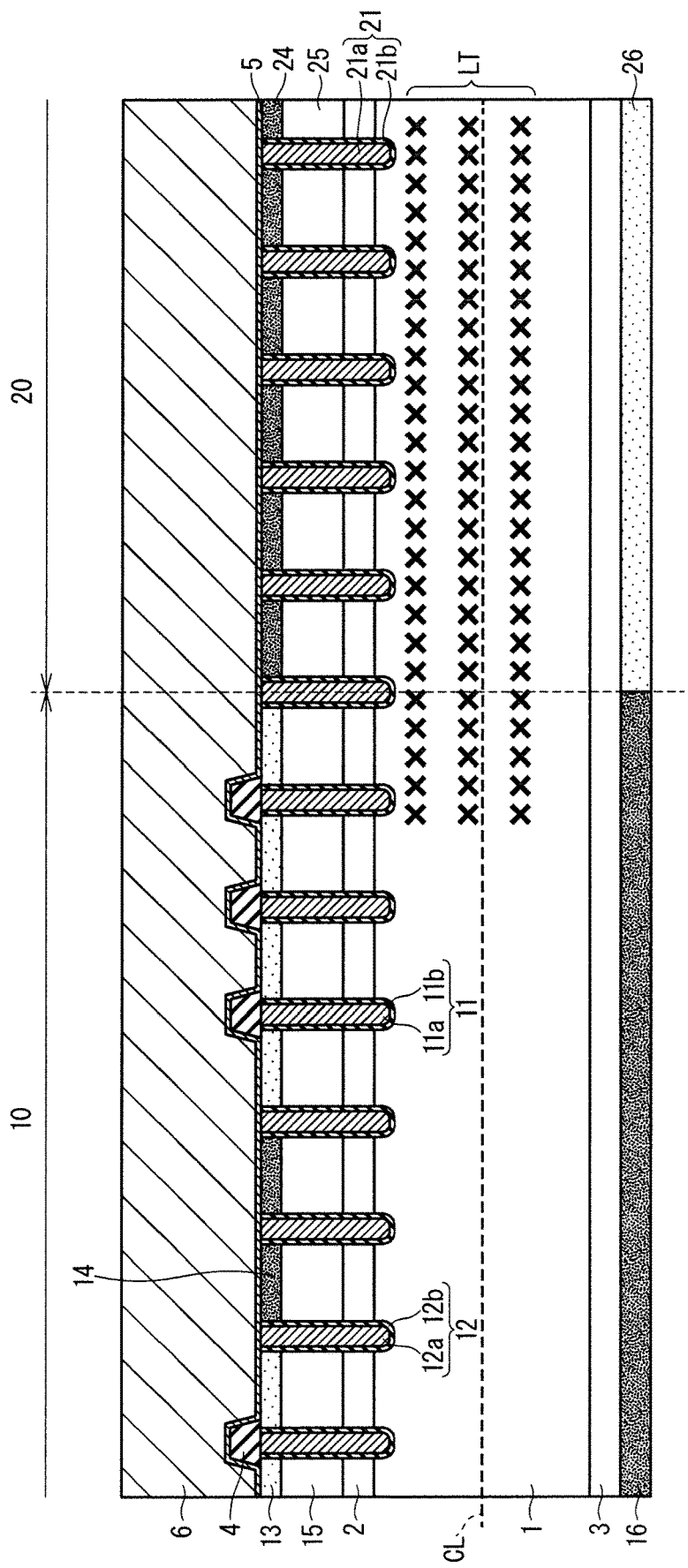

Next, as shown in FIG. 28, the $n^+$-type cathode layer 26 is formed in the diode region 20. The $n^+$-type cathode layer 26 may be formed by implanting phosphorus (P), for example. The implantation dose of n-type impurity for forming the $n^+$-type cathode layer 26 is larger than the implantation dose of the p-type impurity for forming the p-type collector layer 16. While the depth of the p-type collector layer 16 and that of the $n^+$-type cathode layer 26 from the second main surface are shown to be equal to each other in FIG. 28, the depth of the $n^+$-type cathode layer 26 is equal to or greater than that of the p-type collector layer 16. A region for forming the $n^+$-type cathode layer 26 is required to be configured as n-type semiconductor by implanting the n-type impurity into a region implanted with the p-type impurity. Thus, the concentration of the implanted n-type impurity is set higher than the concentration of the p-type impurity in the region entirely for forming the n+-type cathode layer 26.

Next, the collector electrode 7 is formed on the second main surface of the semiconductor substrate to obtain the cross-sectional configuration shown in FIG. 3. The collector electrode 7 is formed on the second main surface to extend over the IGBT region 10, the diode region 20, and the terminal region 30 entirely. The collector electrode 7 may be formed to extend over the second main surface entirely of the n-type wafer as the semiconductor substrate. The collector electrode 7 may be formed by depositing an aluminum silicon alloy (Al—Si based alloy) or titanium (Ti), for example, by PVD such as sputtering or evaporation. Alternatively, the collector electrode 7 may be formed by stacking a plurality of metals such as an aluminum silicon alloy, titanium, nickel, and gold, for example. The collector electrode 7 may further contain a metallic film formed by electroless plating or electrolytic plating on a metallic film formed by PVD.

As a result of the steps described above, the semiconductor device 100 or 101 is formed. Multiple semiconductor devices 100 or 101 are formed in a matrix pattern in one n-type wafer. By cutting the n-type wafer into the semiconductor devices 100 or 101 individually by laser dicing or blade dicing, formation of the semiconductor device 100 or 101 is completed.

The preferred embodiment of the present disclosure can be modified or omitted, if appropriately, within the range of the disclosure.

While the disclosure has been shown and described in detail, the foregoing description is in all aspects illustrative and not restrictive. It is therefore understood that numerous modifications and variations can be devised.

What is claimed is:

1. A semiconductor device comprising a transistor and a diode formed at a common semiconductor substrate,
    the semiconductor substrate including:
        a transistor region in which the transistor is formed; and
        a diode region in which the diode is formed,
    the transistor region including:
        a first semiconductor layer of a first conductivity type provided on a side of a second main surface of the semiconductor substrate;
        a second semiconductor layer of a second conductivity type provided on the first semiconductor layer;
        a third semiconductor layer of the first conductivity type provided closer to a first main surface of the semiconductor substrate than is the second semiconductor layer;
        a fourth semiconductor layer of the second conductivity type provided on the third semiconductor layer;
        a second electrode electrically connected to the fourth semiconductor layer; and
        a first electrode electrically connected to the first semiconductor layer, the diode region including:
        a fifth semiconductor layer of the second conductivity type provided on the side of the second main surface of the semiconductor substrate;
        the second semiconductor layer provided on the fifth semiconductor layer;
        the third semiconductor layer provided closer to the first main surface of the semiconductor substrate than is the second semiconductor layer;
        a sixth semiconductor layer of the first conductivity type provided on the third semiconductor layer;
        the second electrode electrically connected to the sixth semiconductor layer;
        the first electrode electrically connected to the fifth semiconductor layer; and
        a lifetime control layer formed of a crystal defect layer reaching a deeper position than an intermediate position of the second semiconductor layer equidistant between an end of the third semiconductor layer in a thickness direction as viewed from the first main surface and an end of the fifth semiconductor layer in a thickness direction as viewed from the second main surface, wherein
    in the lifetime control layer, a crystal defect density maximum depth is set at a deeper position than the intermediate position, the crystal defect density maximum depth being a depth at which a peak is formed in the density of crystal defect,
    the lifetime control layer includes a projecting part projecting from the diode region into only a part of the of the whole of the transistor region and directly under the fourth semiconductor layer across a boundary between the diode region and the transistor region, and
    with a thickness from the end of the third semiconductor layer in the thickness direction to the intermediate position defined as t1 and a thickness from the intermediate position to the crystal defect density maximum depth defined as t2, the projecting part has a projecting width w in a plane direction projecting from the boundary set to fulfill the following: $w > ((3 \times t1) - t2)/2$.

2. The semiconductor device according to claim 1, wherein
    the lifetime control layer is set a depth greater than the intermediate position and not reaching the fifth semiconductor layer.

3. A semiconductor device comprising a transistor and a diode formed at a common semiconductor substrate,
    the semiconductor substrate including:
        a transistor region in which the transistor is formed; and
        a diode region in which the diode is formed,
    the transistor region including:
        a first semiconductor layer of a first conductivity type provided on a side of a second main surface of the semiconductor substrate;
        a second semiconductor layer of a second conductivity type provided on the first semiconductor layer;
        a third semiconductor layer of the first conductivity type provided closer to a first main surface of the semiconductor substrate than is the second semiconductor layer;
        a fourth semiconductor layer of the second conductivity type provided on the third semiconductor layer;
        a second electrode electrically connected to the fourth semiconductor layer; and
        a first electrode electrically connected to the first semiconductor layer,
    the diode region including:
        a fifth semiconductor layer of the second conductivity type provided on the side of the second main surface of the semiconductor substrate;
        the second semiconductor layer provided on the fifth semiconductor layer;
        the third semiconductor layer provided closer to the first main surface of the semiconductor substrate than is the second semiconductor layer;
        a sixth semiconductor layer of the first conductivity type provided on the third semiconductor layer;

the second electrode electrically connected to the sixth semiconductor layer;

the first electrode electrically connected to the fifth semiconductor layer; and a lifetime control layer formed of a crystal defect layer reaching a deeper position than an intermediate position of the second semiconductor layer equidistant between an end of the third semiconductor layer in a thickness direction as viewed from the first main surface and an end of the fifth semiconductor layer in a thickness direction as viewed from the second main surface, wherein in the lifetime control layer, a crystal defect density maximum depth is set at a deeper position than the intermediate position, the crystal defect density maximum depth being a depth at which a peak is formed in the density of crystal defect, the semiconductor substrate includes a terminal region provided around a region in which at least the diode region and the transistor region are provided, the lifetime control layer includes a projecting part projecting from the diode region into a part of the terminal region across a boundary between the diode region and the terminal region, and with a thickness from the end of the third semiconductor layer in the thickness direction to the intermediate position defined as t1 and a thickness from the intermediate position to the crystal defect density maximum depth defined as t2, the projecting part has a projecting width w in a plane direction projecting from the boundary set to fulfill the following: $w > ((3 \times t1) - t2)/2$.

* * * * *